(12) United States Patent
Kim et al.

(10) Patent No.: US 10,629,816 B2
(45) Date of Patent: Apr. 21, 2020

(54) POLYMER AND ORGANIC SOLAR CELL COMPRISING SAME

(71) Applicant: LG CHEM, LTD., Seoul (KR)

(72) Inventors: Ji Hoon Kim, Daejeon (KR); Doowhan Choi, Daejeon (KR); Songrim Jang, Daejeon (KR); Bogyu Lim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/339,665

(22) PCT Filed: Dec. 13, 2017

(86) PCT No.: PCT/KR2017/014608
§ 371 (c)(1),
(2) Date: Apr. 4, 2019

(87) PCT Pub. No.: WO2018/164353
PCT Pub. Date: Sep. 13, 2018

(65) Prior Publication Data
US 2019/0378987 A1    Dec. 12, 2019

(30) Foreign Application Priority Data

Mar. 6, 2017 (KR) .......................... 10-2017-0028258

(51) Int. Cl.
*H01L 51/00* (2006.01)
*C08G 61/12* (2006.01)
*H01L 51/42* (2006.01)

(52) U.S. Cl.
CPC ........ *H01L 51/0036* (2013.01); *C08G 61/126* (2013.01); *H01L 51/0043* (2013.01); *C08G 2261/124* (2013.01); *C08G 2261/1412* (2013.01); *C08G 2261/18* (2013.01); *C08G 2261/228* (2013.01); *C08G 2261/3223* (2013.01); *C08G 2261/3246* (2013.01); *C08G 2261/91* (2013.01); *H01L 51/4253* (2013.01)

(58) Field of Classification Search
CPC ............ H01L 51/0036; H01L 51/0043; H01L 51/4253; C08G 61/126; C08G 2261/124; C08G 2261/1412; C08G 2261/18; C08G 2261/228; C08G 2261/3223; C08G 2261/3246; C08G 2261/91
See application file for complete search history.

(56) References Cited

U.S. PATENT DOCUMENTS

2013/0200355 A1    8/2013    Zhu et al.
2014/0175339 A1    6/2014    Phillips et al.
(Continued)

FOREIGN PATENT DOCUMENTS

KR    101099601    12/2011
KR    1020130090736    8/2013
(Continued)

OTHER PUBLICATIONS

International Search Report of the International Searching Authority corresponds to International Patent Application No. PCT/KR2017/014608, dated Mar. 23, 2018. (6 pages with English translation).
(Continued)

*Primary Examiner* — Susan D Leong
(74) *Attorney, Agent, or Firm* — Myers Bigel, P.A.

(57) ABSTRACT

The present specification relates to a polymer and an organic solar cell including the same.

20 Claims, 6 Drawing Sheets

(56) References Cited

U.S. PATENT DOCUMENTS

| | | |
|---|---|---|
| 2014/0231784 A1 | 8/2014 | Chen et al. |
| 2014/0290747 A1 | 10/2014 | Kim et al. |
| 2015/0076418 A1 | 3/2015 | Blouin et al. |
| 2016/0155947 A1 | 6/2016 | Kim et al. |
| 2018/0026192 A1 | 1/2018 | Lee et al. |

FOREIGN PATENT DOCUMENTS

| | | |
|---|---|---|
| KR | 1020140067008 | 6/2014 |
| KR | 1020160031958 | 3/2016 |
| KR | 101612609 | 4/2016 |
| KR | 1020160077858 | 7/2016 |
| KR | 1020160089859 | 7/2016 |
| KR | 1020160110199 | 9/2016 |
| WO | 2013135339 | 9/2013 |

OTHER PUBLICATIONS

International Search Report of the International Searching Authority corresponds to International Patent Application No. PCT/KR20171014608, dated Mar. 23, 2018. (6 pages with English translation).

European Search Report corresponding to EP 17900222.5, dated Sep. 24, 2019 (7 pp).

[Figure 1]
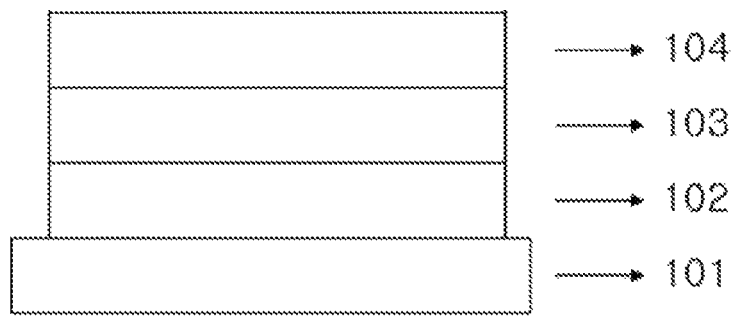
[Figure 2]
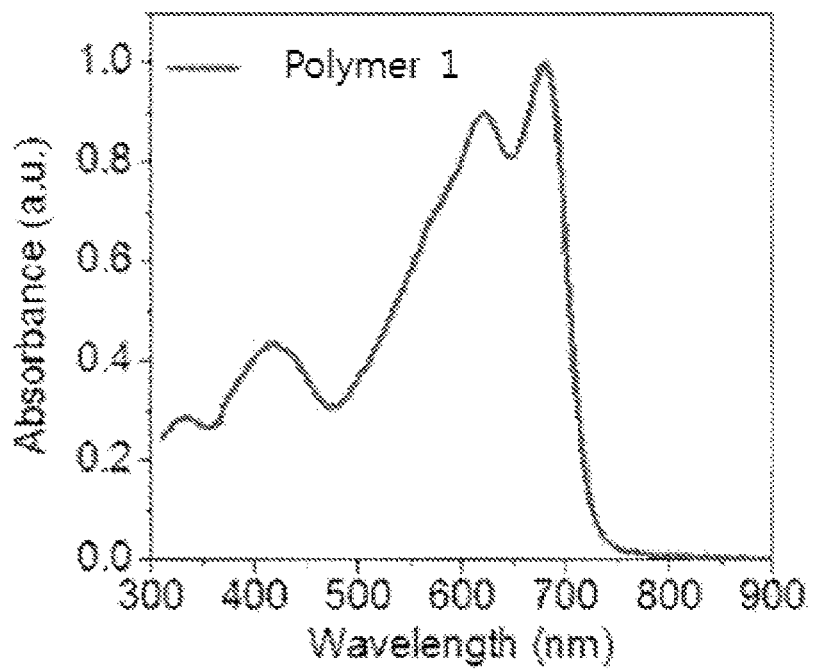

[Figure 3]
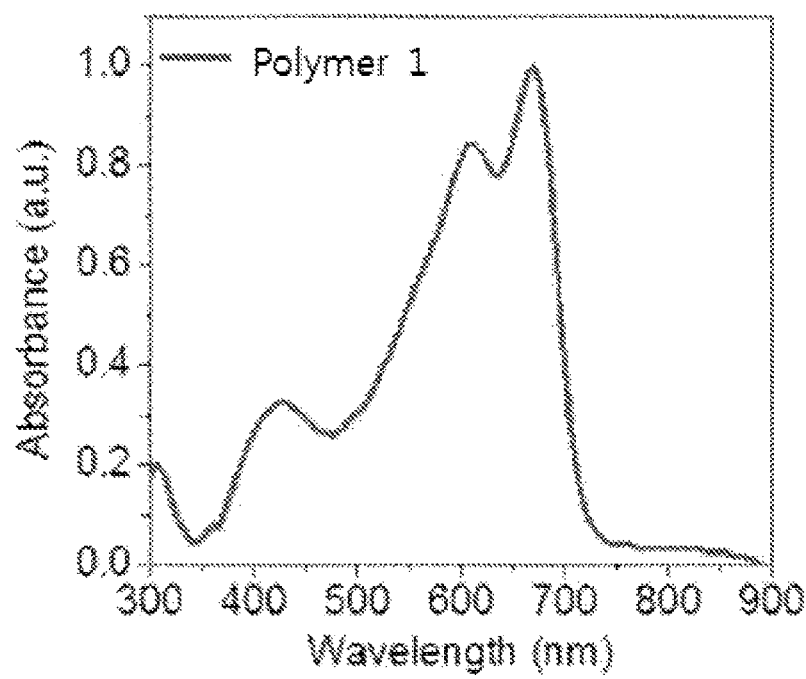
[Figure 4]
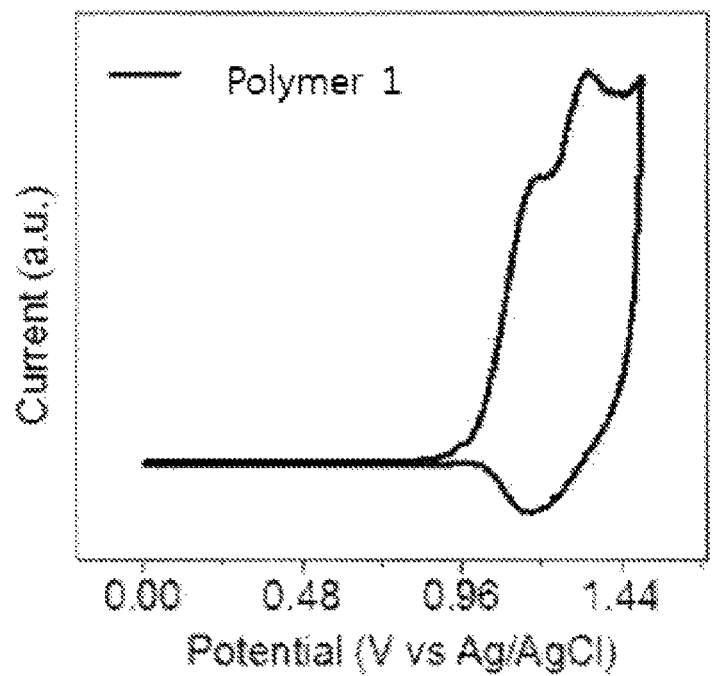

[Figure 5]
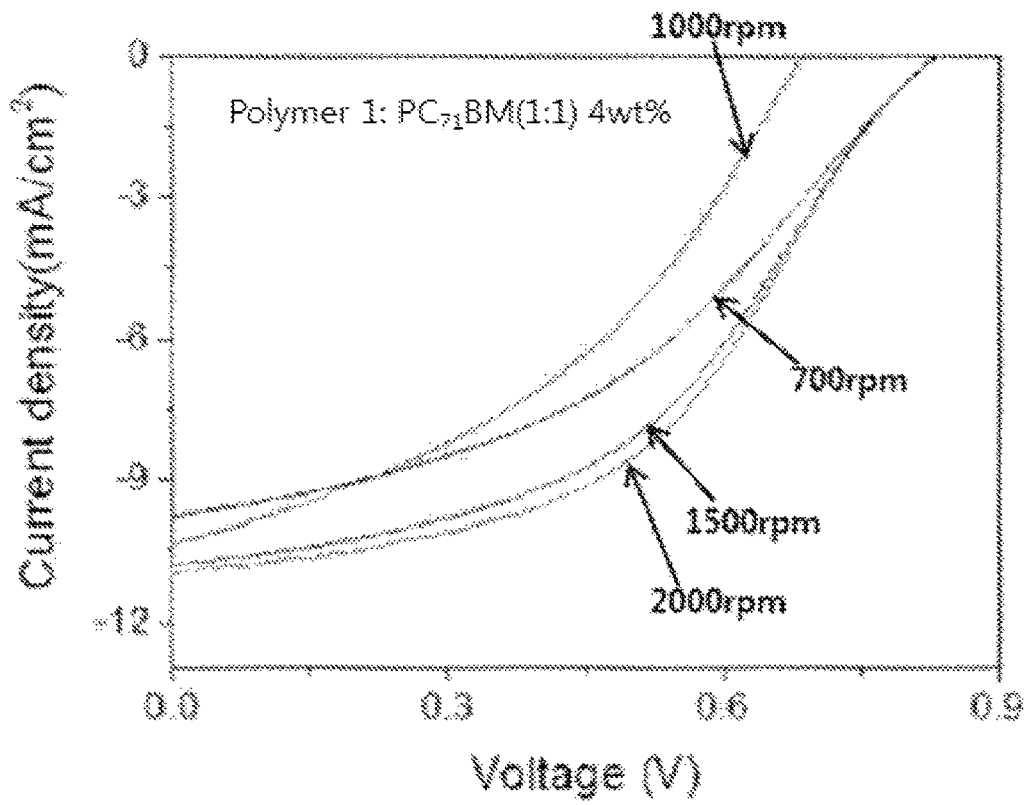
[Figure 6]
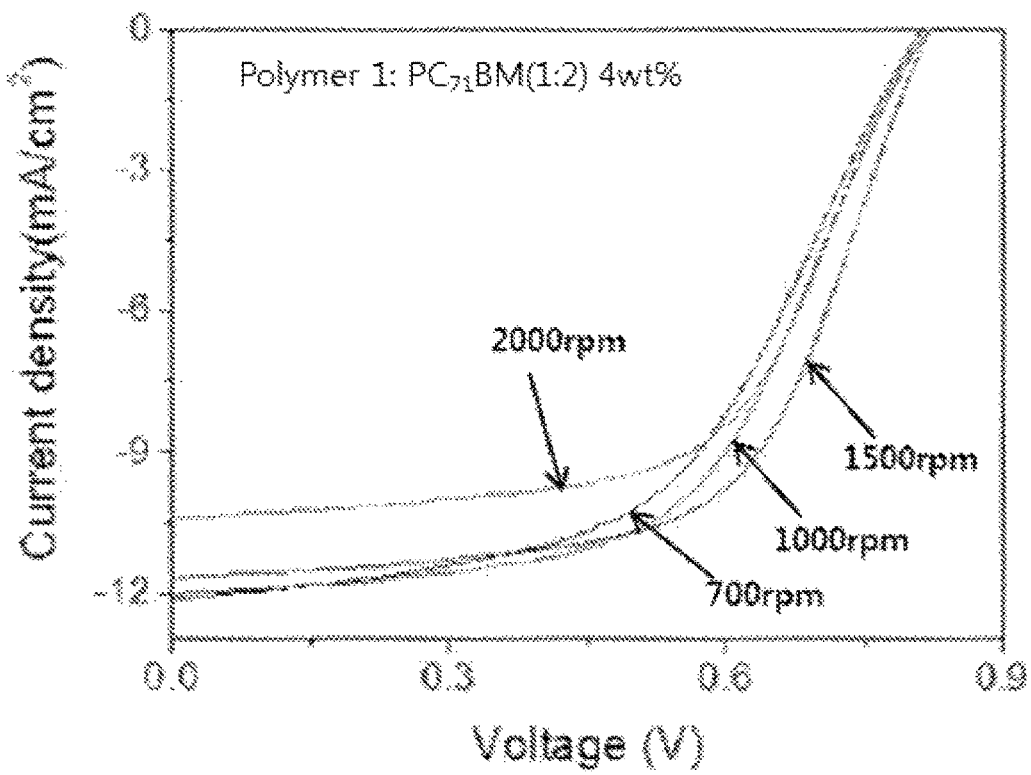

[Figure 7]
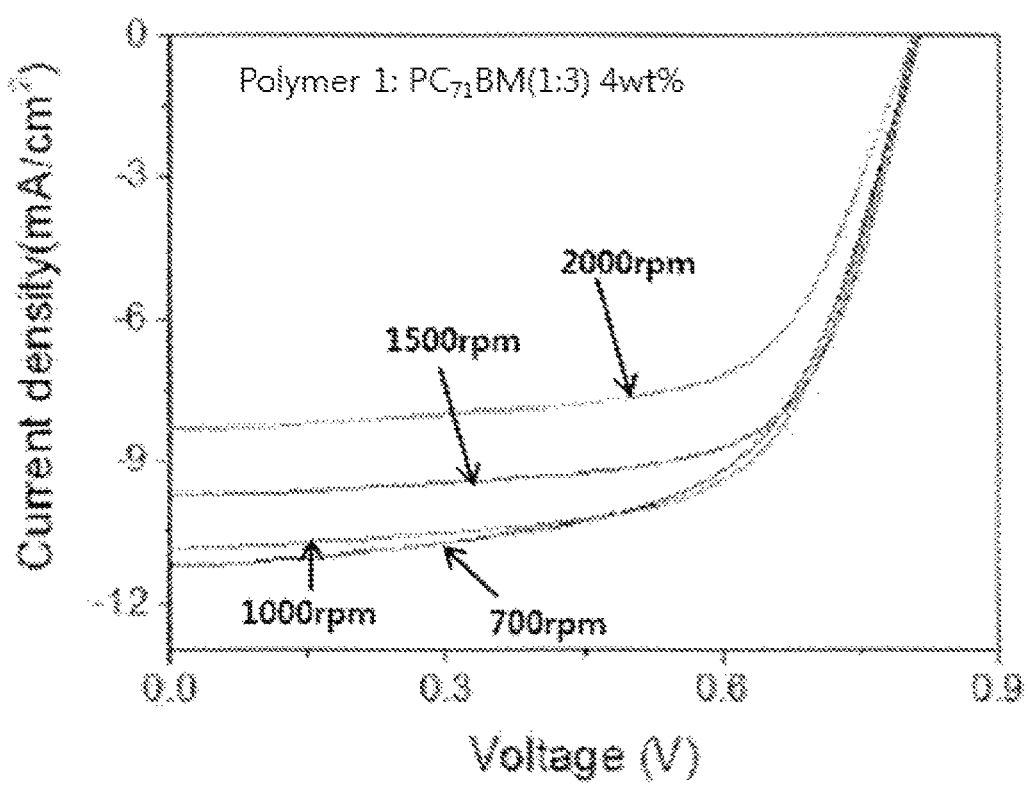

[Figure 8]
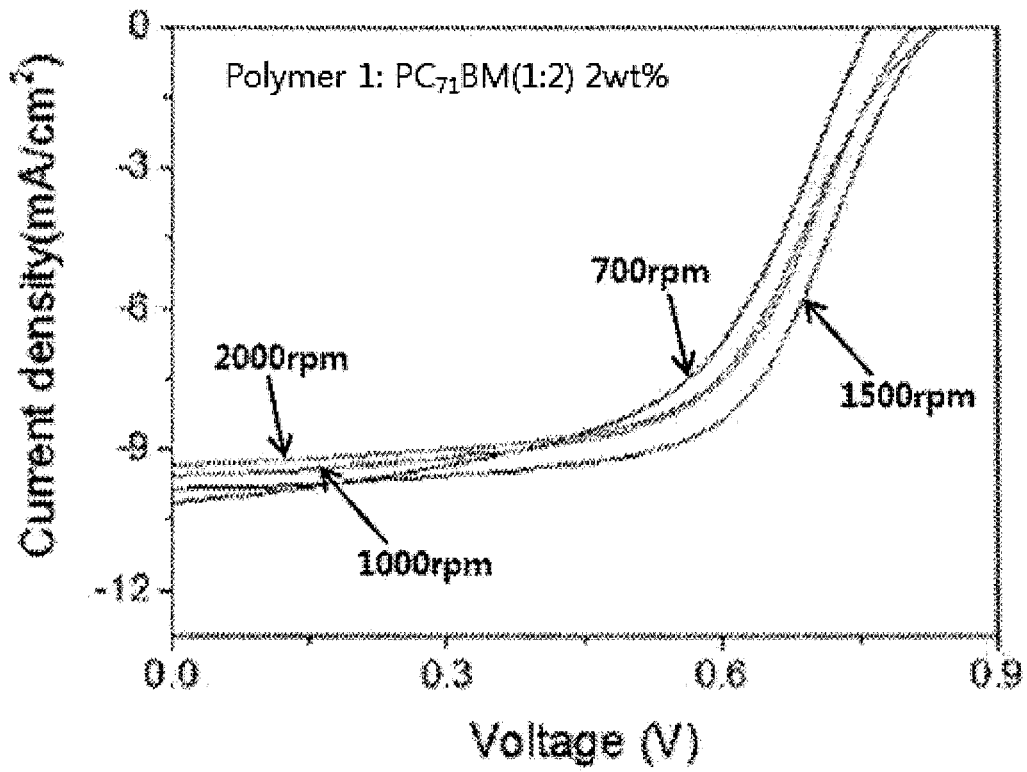
[Figure 9]
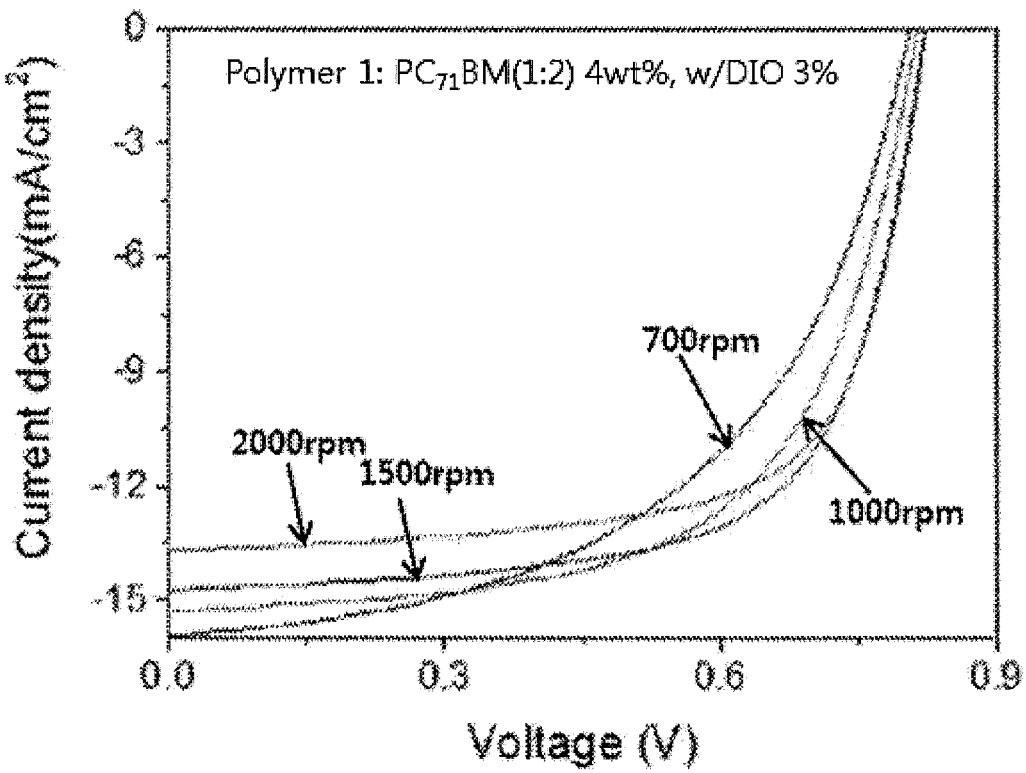

[Figure 10]
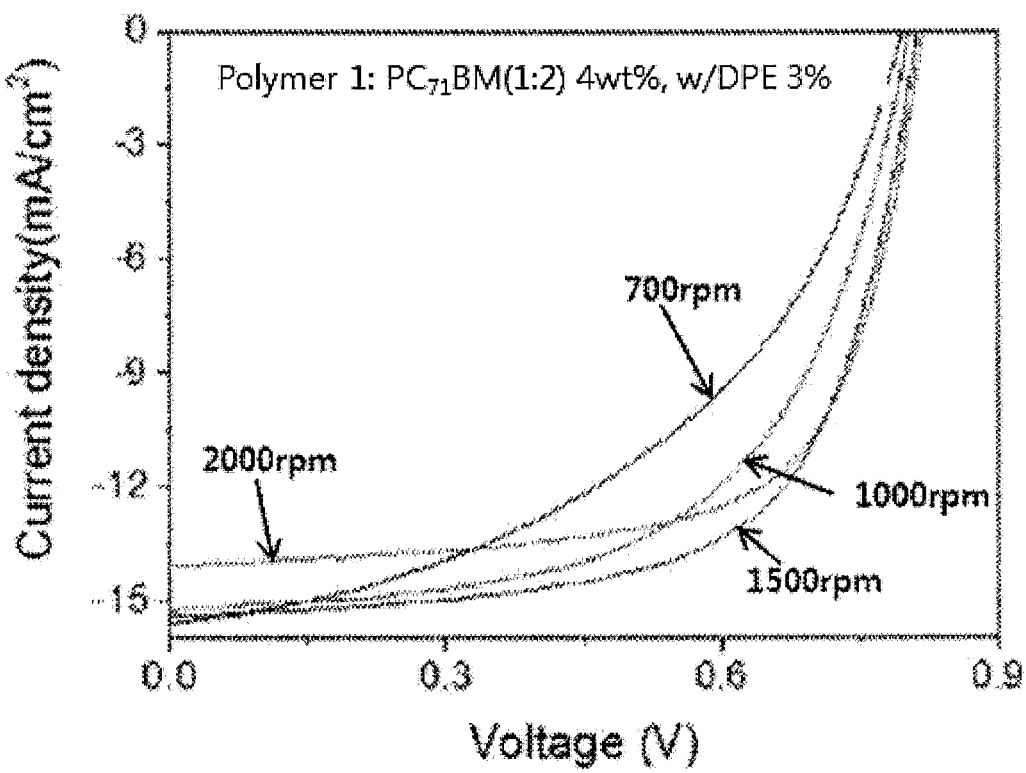
[Figure 11]
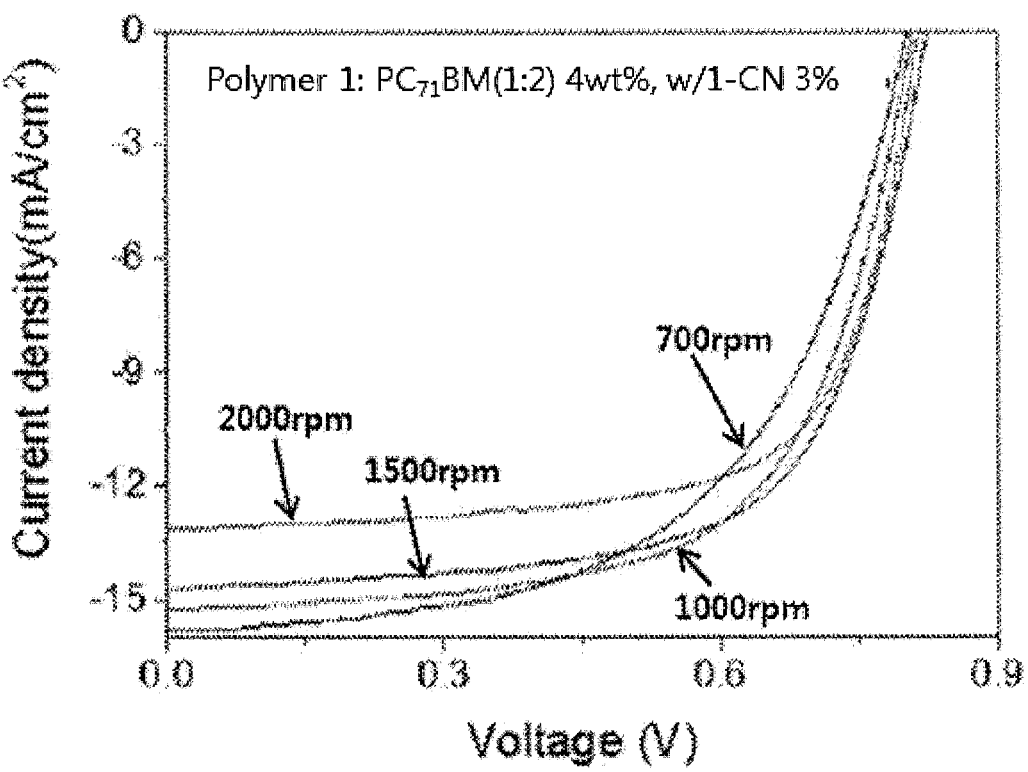

POLYMER AND ORGANIC SOLAR CELL COMPRISING SAME

CROSS REFERENCE TO RELATED APPLICATIONS

This application is a 35 U.S.C. § 371 national stage application of PCT International Application No. PCT/KR2017/014608 filed on Dec. 13, 2017, which claims priority from Korean Patent Application No. 10-2017-0028258 filed on Mar. 6, 2017, the contents of which are incorporated herein by reference in their entireties. The above reference PCT International Application was published in the Korean language as International Publication No. WO 2018/164353 A1 on Sep. 13, 2018.

TECHNICAL FIELD

The present specification relates to a polymer and an organic solar cell including the same.

BACKGROUND ART

An organic solar cell is a device that may directly convert solar energy into electric energy by applying a photovoltaic effect. A solar cell may be divided into an inorganic solar cell and an organic solar cell, depending on the materials constituting a thin film. Typical solar cells are made through a p-n junction by doping crystalline silicon (Si), which is an inorganic semiconductor. Electrons and holes generated by absorbing light diffuse to p-n junction points and move to an electrode while being accelerated by the electric field. The power conversion efficiency in this process is defined as the ratio of electric power given to an external circuit and solar power entering the solar cell, and the efficiency have reached approximately 24% when measured under a currently standardized virtual solar irradiation condition. However, since inorganic solar cells in the related art have already shown the limitation in economic feasibility and material demands and supplies, an organic semiconductor solar cell, which is easily processed and inexpensive and has various functionalities, has come into the spotlight as a long-term alternative energy source.

For the solar cell, it is important to increase efficiency so as to output as much electric energy as possible from solar energy. In order to increase the efficiency of the solar cell, it is important to generate as many excitons as possible inside a semiconductor, but it is also important to pull the generated charges to the outside without loss. One of the reasons for the charge loss is the dissipation of generated electrons and holes due to recombination. Various methods have been proposed to deliver generated electrons and holes to an electrode without loss, but additional processes are required in most cases, and accordingly, manufacturing costs may be increased.

REFERENCES OF THE RELATED ART

Patent Document

Korean Patent Application Laid-Open No. 2014-0025621

Non-Patent Document

Two-Layer Organic Photovoltaic Cell (C. W. Tang, Appl. Phys. Lett., 48, 183. (1986))

Efficiencies via Network of Internal Donor-Acceptor Heterojunctions (G. Yu, J. Gao, J. C. Hummelen, F. Wudl, A. J. Heeger, Science, 270, 1789. (1995))

DISCLOSURE

Technical Problem

An object of the present specification is to provide a polymer and an organic solar cell including the same.

Technical Solution

The present specification provides a polymer including a first unit represented by the following Chemical Formula 1; and a second unit represented by the following Chemical Formula 2.

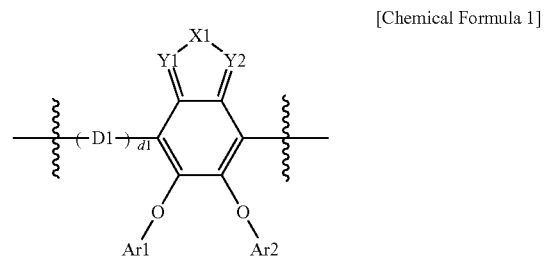

[Chemical Formula 1]

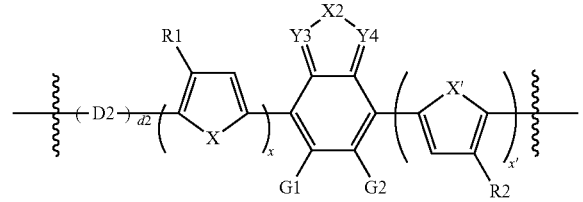

[Chemical Formula 2]

In Chemical Formulae 1 and 2,
d1, d2, x, and x' are each 1 or 2,
when d1, d2, x, and x' are each 2, structures in the parenthesis are the same as or different from each other,
X1 and X2 are the same as or different from each other, and are each independently CRR', NR, O, SiRR', PR, S, GeRR', Se or Te,
Y1 to Y4 are the same as or different from each other, and are each independently CR", N, SiR", P, or GeR",
X and X' are the same as or different from each other, and are each independently S or Se,
Ar1 and Ar2 are the same as or different from each other, and are each independently a substituted or unsubstituted straight or branched alkyl group,
R1 and R2 are the same as or different from each other, and are each independently a substituted or unsubstituted branched alkyl group,
G1 and G2 are the same as or different from each other, and are each independently hydrogen; or fluorine,
R, R', and R" are the same as or different from each other, and are each independently hydrogen; deuterium; a halogen group; a hydroxy group; a substituted or unsubstituted alkyl group; a substituted or unsubstituted alkoxy group; a substituted or unsubstituted aryl group; or a substituted or unsubstituted heterocyclic group, and
D1 and D2 are the same as or different from each other, and are each independently any one selected from the following structures,

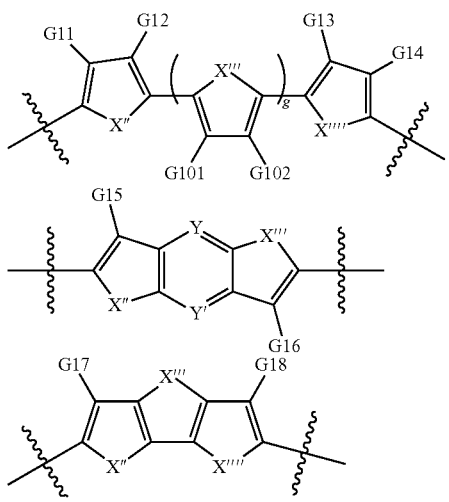

in the structures,

X'', X''', and X'''' are the same as or different from each other, and are each independently S or Se, Y and Y' are the same as or different from each other, and are each independently CR''', N, SiR''', P, or GeR''', G11 to G18, G101, and G102 are the same as or different from each other, and are each independently hydrogen; or fluorine, R''' is hydrogen; deuterium; a halogen group; a hydroxy group; a substituted or unsubstituted alkyl group; a substituted or unsubstituted alkoxy group; a substituted or unsubstituted aryl group; or a substituted or unsubstituted heterocyclic group, and g is 0 or 1.

Further, the present specification provides an organic solar cell including: a first electrode; a second electrode which is disposed to face the first electrode; and an organic material layer having one or more layers which is disposed between the first electrode and the second electrode and includes a photoactive layer, in which one or more layers of the organic material layer include the above-described polymer.

Advantageous Effects

A polymer according to an exemplary embodiment of the present specification may absorb light in a wide region as the conjugation length is increased, and may maintain or improve open voltage increased by the absorption of light through Ar1 and Ar2 of Chemical Formula 1, thereby providing a device having high efficiency.

Further, when an organic solar cell including the polymer according to an exemplary embodiment of the present specification is manufactured, the organic solar cell may be manufactured at room temperature, so that the organic solar cell is economically efficient in terms of time and costs because a heat treatment at high temperature and a process time are not needed unlike an organic solar cell in the related art.

BRIEF DESCRIPTION OF DRAWINGS

FIG. 1 is a view illustrating an organic solar cell according to an exemplary embodiment of the present specification.

FIGS. 2 and 3 are a graph illustrating a UV-vis absorption spectrum of Polymer 1.

FIG. 4 is a cyclic voltammetry graph of Polymer 1.

FIG. 5 is a view illustrating the current density according to the voltage in organic solar cells according to Experimental Examples 1-1 to 1-4.

FIG. 6 is a view illustrating the current density according to the voltage in organic solar cells according to Experimental Examples 2-1 to 2-4.

FIG. 7 is a view illustrating the current density according to the voltage in organic solar cells according to Experimental Examples 3-1 to 3-4.

FIG. 8 is a view illustrating the current density according to the voltage in organic solar cells according to Experimental Examples 4-1 to 4-4.

FIG. 9 is a view illustrating the current density according to the voltage in organic solar cells according to Experimental Examples 5-1 to 5-4.

FIG. 10 is a view illustrating the current density according to the voltage in organic solar cells according to Experimental Examples 6-1 to 6-4.

FIG. 11 is a view illustrating the current density according to the voltage in organic solar cells according to Experimental Examples 7-1 to 7-4.

MODE FOR INVENTION

Hereinafter, the present specification will be described in more detail.

In the present specification, the 'unit' means a repeated structure in which a monomer is included in a polymer, and a structure in which the monomer is bonded into the polymer by polymerization.

In the present specification, the meaning of 'including a unit' means that the unit is included in a main chain in the polymer.

When one part "includes" one constituent element in the present specification, unless otherwise specifically described, this does not mean that another constituent element is excluded, but means that another constituent element may be further included.

In an exemplary embodiment of the present specification, the polymer includes the first unit represented by Chemical Formula 1 and the second unit represented by Chemical Formula 2.

In another exemplary embodiment of the present specification, the polymer includes one or two or more first units represented by Chemical Formula 1 and one or two or more second units represented by Chemical Formula 2, which are included in the polymer.

In the present specification, when two or more first units and/or second units are included in the polymer, the two or more first units and/or second units may be the same as or different from each other. By adjusting the plurality of first units and/or second units equally or differently, it is possible to adjust the solubility of a polymer required when a device is manufactured and/or the service life, efficiency characteristics, and the like of the device.

The first unit represented by Chemical Formula 1 includes an alkoxy group, and the second unit represented by Chemical Formula 2 includes fluorine and a branched alkyl group. Accordingly, when the polymer simultaneously includes the first unit represented by Chemical Formula 1 and the second unit represented by Chemical Formula 2, the solubility of the polymer is excellent. In this case, there is an economic advantage in terms of time and/or costs when a device is manufactured.

Furthermore, a polymer according to an exemplary embodiment of the present specification may absorb light in a wide region as the conjugation length is increased, and may maintain or improve open voltage increased by the absorption of light through a change in alkyl chains of Ar1 and Ar2 of Chemical Formula 1, thereby providing a device having high efficiency.

Further, when an organic solar cell including the polymer according to an exemplary embodiment of the present specification is manufactured, the organic solar cell may be manufactured at room temperature, so that the organic solar cell is economically efficient in terms of time and costs because a heat treatment at high temperature and a process time are not needed unlike an organic solar cell in the related art.

In addition, in an exemplary embodiment of the present specification, the first unit including —O—Ar1 and —O—Ar2 increases a HOMO energy level value, and the second unit including G1 and G2 decreases a HOMO energy level value. Accordingly, a highly efficient organic solar cell may be implemented by adjusting a ratio of the first unit and the second unit to adjust an appropriate HOMO energy level.

In the present specification, the energy level means a size of energy. Accordingly, even when the energy level is expressed in the negative (-) direction from the vacuum level, it is interpreted that the energy level means an absolute value of the corresponding energy value. For example, the HOMO energy level means the distance from the vacuum level to the highest occupied molecular orbital. Further, the LUMO energy level means the distance from the vacuum level to the lowest unoccupied molecular orbital.

In addition, the meaning of decreasing the HOMO energy level value means that the absolute value of the energy level is increased, and the meaning of increasing the HOMO energy level value means that the absolute value of the energy level is decreased.

Examples of the substituents will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means being substituted with one or more substituents selected from the group consisting of deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted aryl group; and a substituted or unsubstituted heterocyclic group or being substituted with a substituent to which two or more substituents are linked among the substituents exemplified above, or having no substituent. For example, "the substituent to which two or more substituents are linked" may be a biphenyl group. That is, the biphenyl group may also be an aryl group, and may be interpreted as a substituent to which two phenyl groups are linked.

In the present specification, the number of carbon atoms of an imide group is not particularly limited, but is prefer-ably 1 to 30. Specifically, the imide group may be a compound having the following structures, but is not limited thereto.

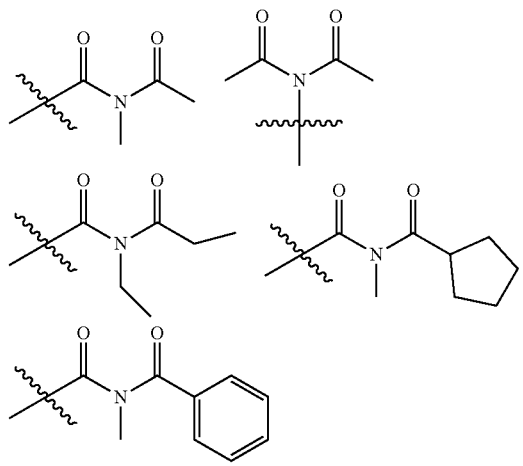

In the present specification, for an amide group, one or two nitrogen atoms of the amide group may be substituted with hydrogen, a straight, branched, or cyclic alkyl group having 1 to 30 carbon atoms, or an aryl group having 6 to 30 carbon atoms. Specifically, the amide group may be a compound having the following structural formulae, but is not limited thereto.

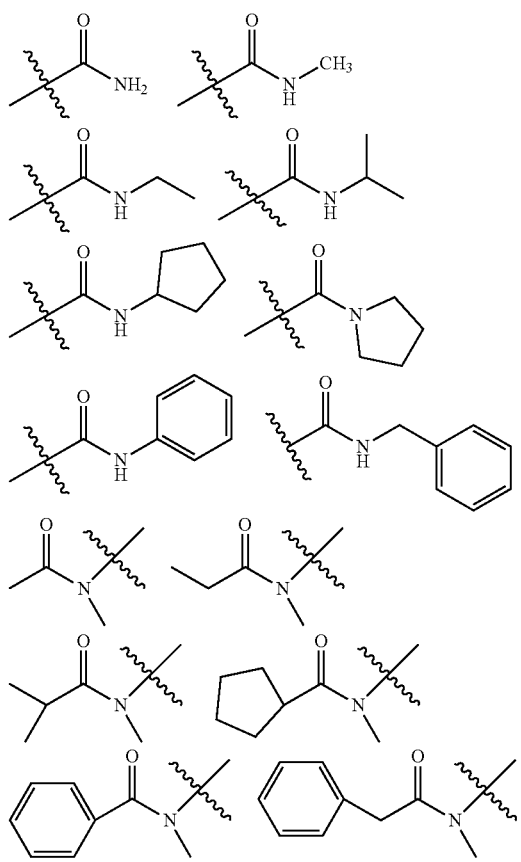

In the present specification, examples of a halogen group include fluorine, chlorine, bromine or iodine.

In the present specification, the alkyl group may be straight or branched, and the number of carbon atoms thereof is not particularly limited, but is preferably 1 to 50. Specific examples thereof include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present specification, a cycloalkyl group is not particularly limited, but the number of carbon atoms thereof is preferably 3 to 60, and specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, the alkoxy group may be straight, branched, or cyclic. The number of carbon atoms of the alkoxy group is not particularly limited, but is preferably 1 to 20. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy, and the like, but are not limited thereto.

In the present specification, the alkenyl group may be straight or branched, and the number of carbon atoms thereof is not particularly limited, but is preferably 2 to 40. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, when the aryl group is a monocyclic aryl group, the number of carbon atoms thereof is not particularly limited, but is preferably 6 to 25. Specific examples of the monocyclic aryl group include a phenyl group, a biphenyl group, a terphenyl group, and the like, but are not limited thereto.

In the present specification, when the aryl group is a polycyclic aryl group, the number of carbon atoms thereof is not particularly limited, but is preferably 10 to 24. Specific examples of the polycyclic aryl group include a naphthyl group, an anthracenyl group, a phenanthryl group, a pyrenyl group, a perylenyl group, a chrysenyl group, a fluorenyl group, and the like, but are not limited thereto.

In the present specification, the fluorenyl group may be substituted, and adjacent substituents may be bonded to each other to form a ring.

When the fluorenyl group is substituted, the fluorenyl group may be

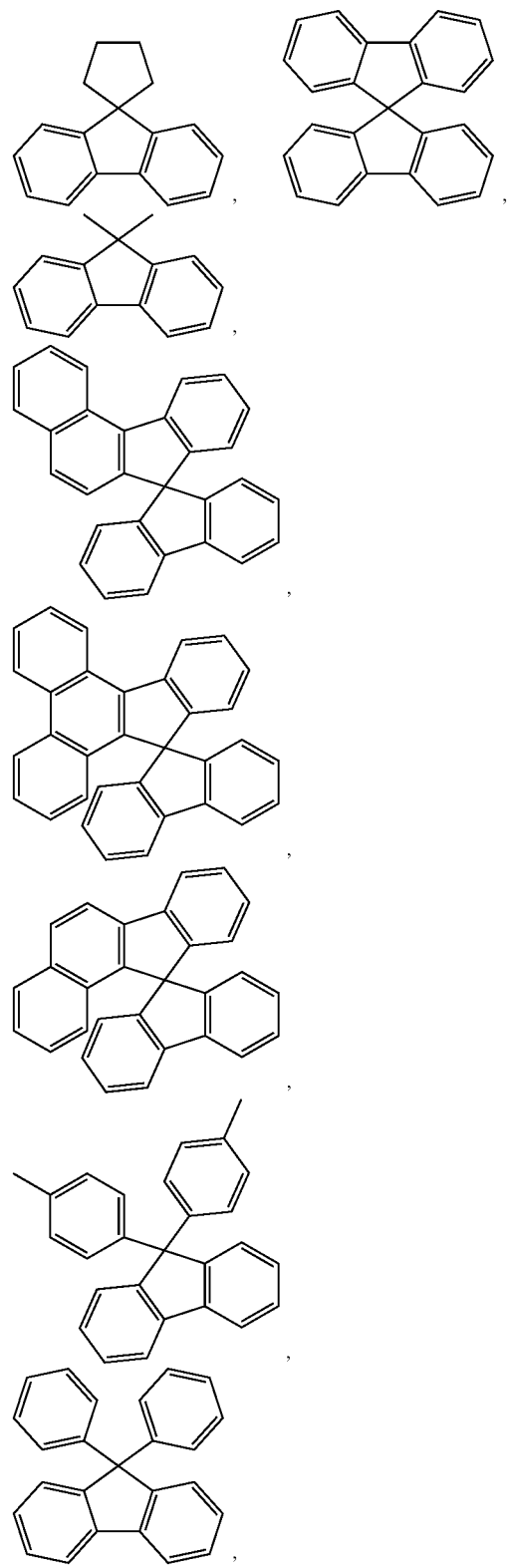

and the like. However, the fluorenyl group is not limited thereto.

In the present specification, a heterocyclic group includes one or more atoms other than carbon, that is, one or more heteroatoms, and specifically, the heteroatom may include one or more atoms selected from the group consisting of O, N, Si, Se, S, and the like. The number of carbon atoms of the heterocyclic group is not particularly limited, but is preferably 2 to 60. Examples of the heterocyclic group include a thiophene group, a furan group, a pyrrole group, an imidazole group, a triazole group, an oxazole group, an oxadiazole group, a triazole group, a pyridyl group, a bipyridyl group, a pyrimidyl group, a triazine group, an acridyl group, a pyridazine group, a pyrazinyl group, a qinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, a thiadiazolyl group, a benzothiazolyl group, a phenothiazinyl group, a dibenzofuranyl group, and the like, but are not limited thereto.

In the present specification, the number of carbon atoms of an amine group is not particularly limited, but is preferably 1 to 30. An N atom in the amine group may be substituted with an aryl group, an alkyl group, an arylalkyl group, a heterocyclic group, and the like, and specific examples of the amine group include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a phenylnaphthylamine group, a ditolylamine group, a phenyltolylamine group, a triphenylamine group, and the like, but are not limited thereto.

In the present specification, the aryl group in the aryloxy group, the arylthioxy group, and the arylsulfoxy group is the same as the above-described examples of the aryl group. Specifically, examples of the aryloxy group include phenoxy, p-tolyloxy, m-tolyloxy, 3,5-dimethyl-phenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, 9-phenanthryloxy, and the like, examples of the arylthioxy group include a phenylthioxy group, a 2-methylphenylthioxy group, a 4-tert-butylphenylthioxy group, and the like, and examples of the arylsulfoxy group include a benzenesulfoxy group, a p-toluenesulfoxy group, and the like, but the examples are not limited thereto.

In the present specification, the alkyl group in the alkylthioxy group and the alkylsulfoxy group is the same as the above-described examples of the alkyl group. Specifically, examples of the alkylthioxy group include a methylthioxy group, an ethylthioxy group, a tert-butylthioxy group, a hexylthioxy group, an octylthioxy group, and the like, and examples of the alkylsulfoxy group include methylsulfoxy group, an ethylsulfoxy group, a propylsulfoxy group, a butylsulfoxy group, and the like, but the examples are not limited thereto.

According to an exemplary embodiment of the present specification, in Chemical Formula 1, X1 is S.

According to an exemplary embodiment of the present specification, in Chemical Formula 1, Y1 is N.

According to an exemplary embodiment of the present specification, in Chemical Formula 1, Y2 is N.

According to an exemplary embodiment of the present specification, in Chemical Formula 1, d1 is 1.

In an exemplary embodiment of the present specification, one or more first units represented by Chemical Formula 1 is or are included.

In an exemplary embodiment of the present specification, the first unit represented by Chemical Formula 1 is represented by the following Chemical Formula 1-1.

[Chemical Formula 1-1]

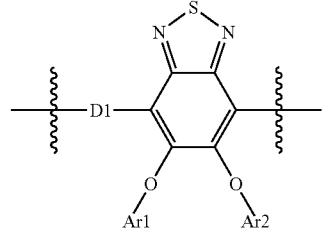

In Chemical Formula 1-1,
Ar1, Ar2, and D1 are the same as those defined in Chemical Formula 1.

According to an exemplary embodiment of the present specification, in Chemical Formula 1, D1 is any one selected from the following structures.

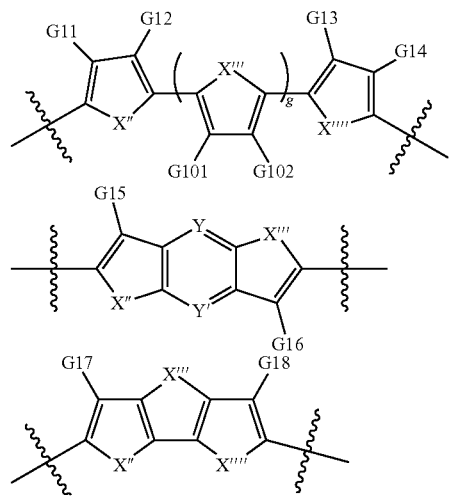

In the structures,
X", X''', and X'''' are the same as or different from each other, and are each independently S or Se,
Y and Y' are the same as or different from each other, and are each independently CR''', N, SiR''', P, or GeR''',
G11 to G18, G101, and G102 are the same as or different from each other, and are each independently hydrogen; or fluorine,
R''' is hydrogen; deuterium; a halogen group; a hydroxy group; a substituted or unsubstituted alkyl group; a substituted or unsubstituted alkoxy group; a substituted or unsubstituted aryl group; or a substituted or unsubstituted heterocyclic group, and
g is 0 or 1.

In the structures, X", X''', and X'''' are S.
In the structures, Y and Y' are the same as or different from each other, and are each independently CR'''.

According to an exemplary embodiment of the present specification, D1 is any one selected from the following structures.

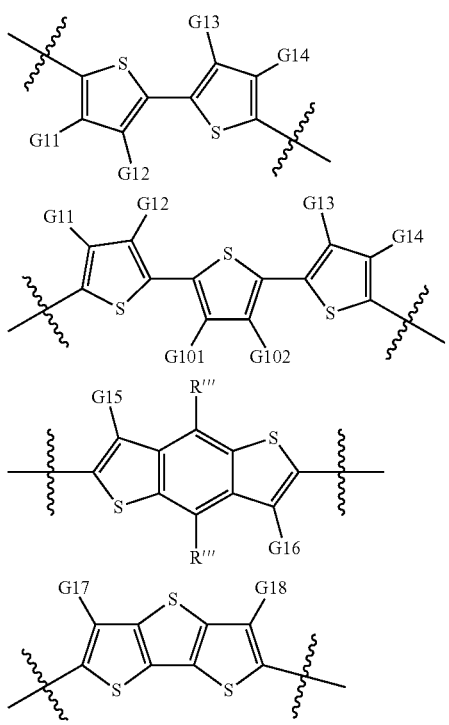

In the structures,

G11 to G18, G101, G102, and R''' are the same as those described above.

In an exemplary embodiment of the present specification, Chemical Formula 1 is represented by any one of the following Chemical Formulae 1-2 to 1-5.

[Chemical Formula 1-2]

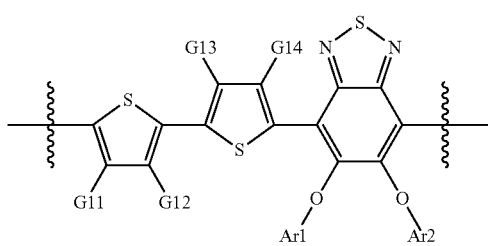

[Chemical Formula 1-3]

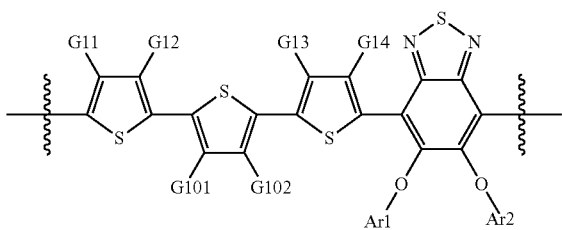

[Chemical Formula 1-4]

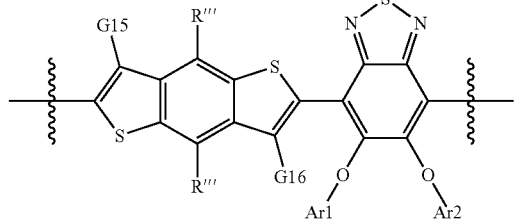

[Chemical Formula 1-5]

In Chemical Formulae 1-2 to 1-5,

Ar1 and Ar2 are the same as those defined in Chemical Formula 1,

G11 to G18, G101, and G102 are the same as or different from each other, and are each independently hydrogen; or fluorine, and R''' is hydrogen; deuterium; a halogen group; a hydroxy group; a substituted or unsubstituted alkyl group; a substituted or unsubstituted alkoxy group; a substituted or unsubstituted aryl group; or a substituted or unsubstituted heterocyclic group.

According to an exemplary embodiment of the present specification, in Chemical Formula 2, X2 is S.

According to an exemplary embodiment of the present specification, in Chemical Formula 2, Y3 is N.

According to an exemplary embodiment of the present specification, in Chemical Formula 2, Y4 is N.

According to an exemplary embodiment of the present specification, in Chemical Formula 2, X is S.

According to an exemplary embodiment of the present specification, in Chemical Formula 2, X' is S.

According to an exemplary embodiment of the present specification, in Chemical Formula 2, d2 is 1.

According to an exemplary embodiment of the present specification, in Chemical Formula 2, x is 1.

According to an exemplary embodiment of the present specification, in Chemical Formula 2, x' is 1.

In an exemplary embodiment of the present specification, one or more second units represented by Chemical Formula 2 is or are included.

In an exemplary embodiment of the present specification, the second unit represented by Chemical Formula 2 is represented by the following Chemical Formula 2-1.

[Chemical Formula 2-1]

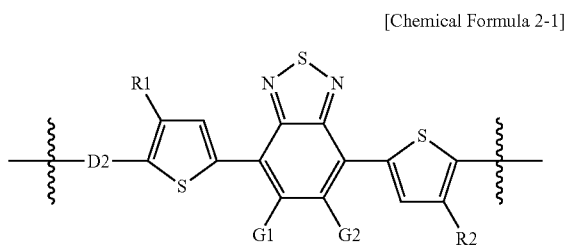

In Chemical Formula 2-1,
R1, R2, G1, G2, and D2 are the same as those defined in Chemical Formula 2.

According to an exemplary embodiment of the present specification, in Chemical Formula 1, D2 is any one selected from the following structures.

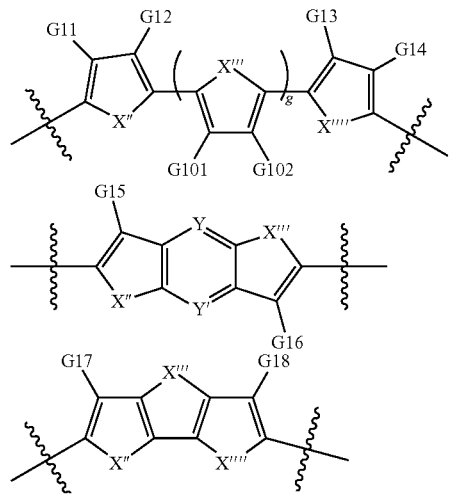

In the structures,
X", X''', and X'''' are the same as or different from each other, and are each independently S or Se,
Y and Y' are the same as or different from each other, and are each independently CR''', N, SiR''', P, or GeR''',
G11 to G18, G101, and G102 are the same as or different from each other, and are each independently hydrogen; or fluorine, R''' is hydrogen; deuterium; a halogen group; a hydroxy group; a substituted or unsubstituted alkyl group; a substituted or unsubstituted alkoxy group; a substituted or unsubstituted aryl group; or a substituted or unsubstituted heterocyclic group, and
g is 0 or 1.

In the structures, X", X''', and X'''' are S.
In the structures, Y and Y' are the same as or different from each other, and are each independently CR'''.

According to an exemplary embodiment of the present specification, D2 is any one selected from the following structures.

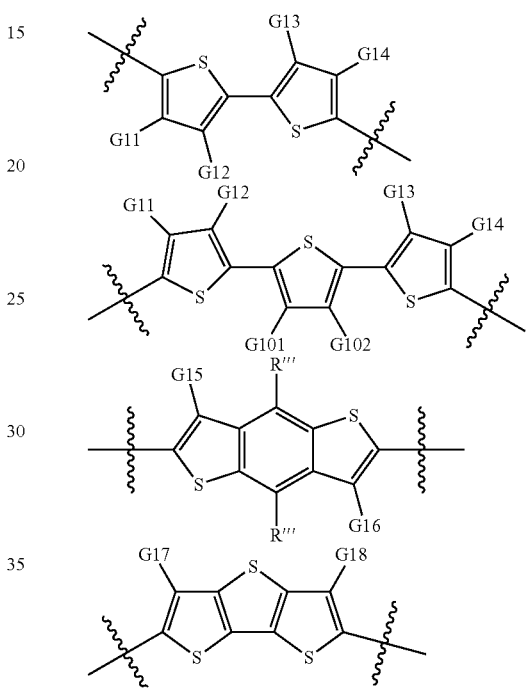

In the structures,
G11 to G18, G101, G102, and R''' are the same as those described above.

In an exemplary embodiment of the present specification, Chemical Formula 2 is represented by any one of the following Chemical Formulae 2-2 to 2-5.

[Chemical Formula 2-2]

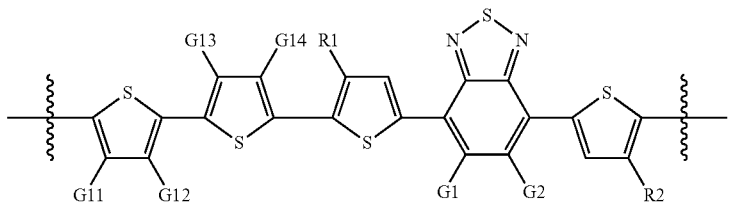

[Chemical Formula 2-3]

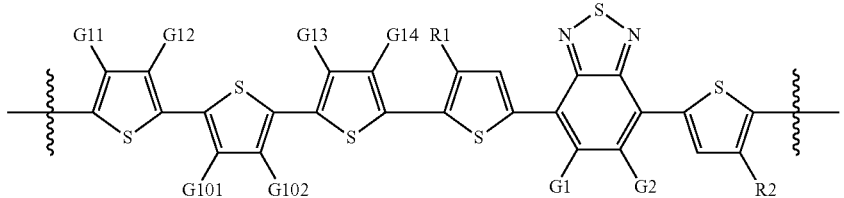

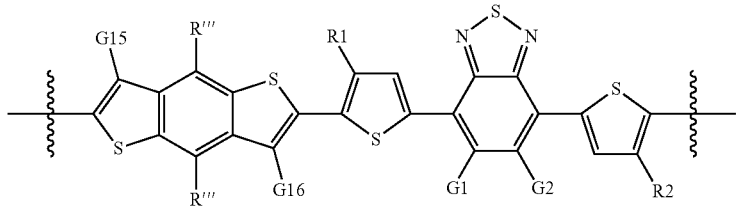

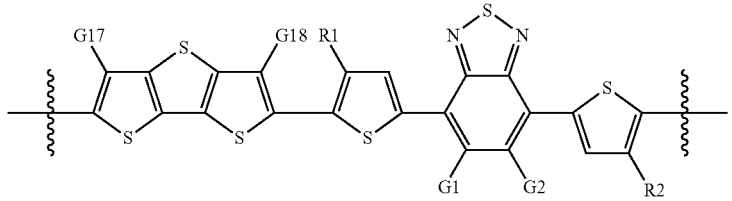

In Chemical Formulae 2-2 to 2-5, R1, R2, G1, and G2 are the same as those defined in Chemical Formula 2, G11 to G18, G101, and G102 are the same as or different from each other, and are each independently hydrogen; or fluorine, R''' is hydrogen; deuterium; a halogen group; a hydroxy group; a substituted or unsubstituted alkyl group; a substituted or unsubstituted alkoxy group; a substituted or unsubstituted aryl group; or a substituted or unsubstituted heterocyclic group.

In an exemplary embodiment of the present specification, when d2, x, and x' in Chemical Formula 2 are 1 and d1 in Chemical Formula 1 is 1, rotation of the molecule may be prevented and the planarity may be increased through interaction of S of X and X' with a halogen group of G1 and G2 or O atoms of Chemical Formula 1.

In an exemplary embodiment of the present specification, the polymer including the first unit and the second unit is an alternate polymer.

In another exemplary embodiment, the polymer including the first unit and the second unit is a random polymer.

In an exemplary embodiment of the present specification, the polymer includes a unit represented by the following Formula 4 or 5.

[Chemical Formula 4]

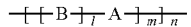

[Chemical Formula 2-4]

[Chemical Formula 2-5]

-continued

[Chemical Formula 5]

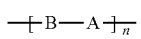

In Chemical Formulae 4 and 5,

A is the first unit represented by Chemical Formula 1,

B is the second unit represented by Chemical Formula 2, l is a mole fraction and 0<l<1, m is a mole fraction and 0<m<1, l+m=1, and n is a repeating number of the unit, and an integer from 1 to 10,000.

In the present specification, a polymer including the unit represented by Chemical Formula 4 may constitute an alternate polymer by including a unit composed only of the first unit and the second unit.

In the present specification, a polymer including the unit represented by Chemical Formula 5 may constitute a random polymer by including a unit composed only of the first unit and the second unit, and the contents of the first unit and the second unit may be adjusted according to the mole fraction of l and m.

In an exemplary embodiment of the present specification, the unit represented by Chemical Formula 4 is represented by any one of the following Formulae 4-1 to 4-16.

In another exemplary embodiment, the unit represented by Chemical Formula 5 is represented by any one of the following Formulae 5-1 to 5-16.

In an exemplary embodiment of the present specification, the polymer includes a unit represented by any one of the following Chemical Formulae 4-1 to 4-16 and 5-1 to 5-16.

[Chemical Formula 4-1]

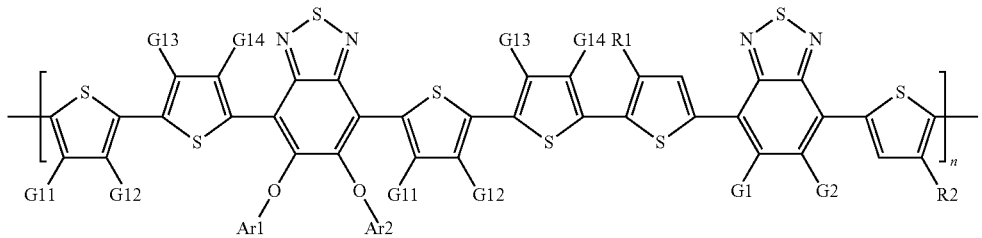

[Chemical Formula 4-2]
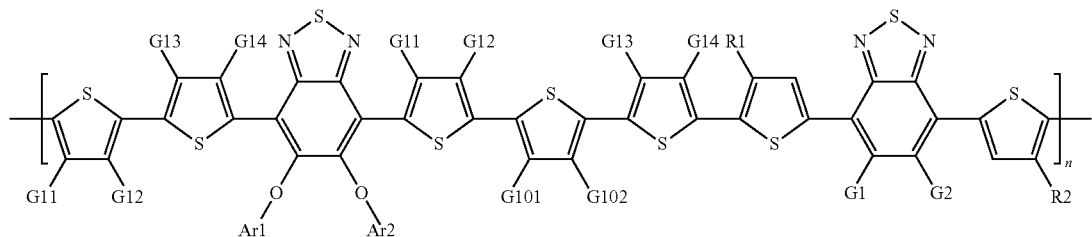
[Chemical Formula 4-3]
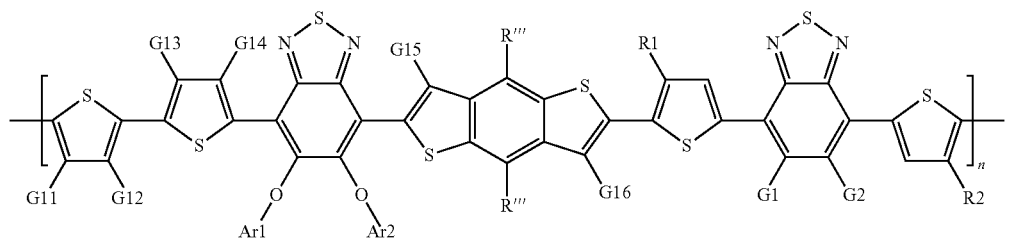
[Chemical Formula 4-4]
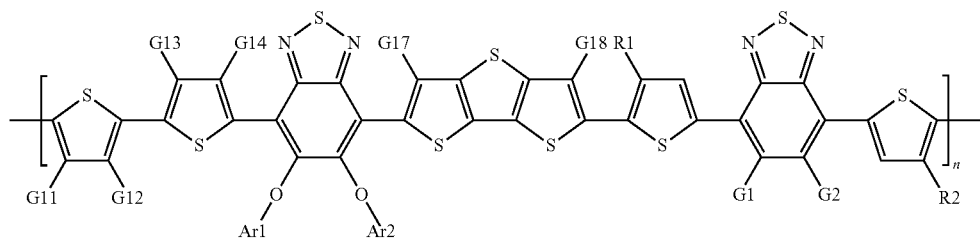
[Chemical Formula 4-5]
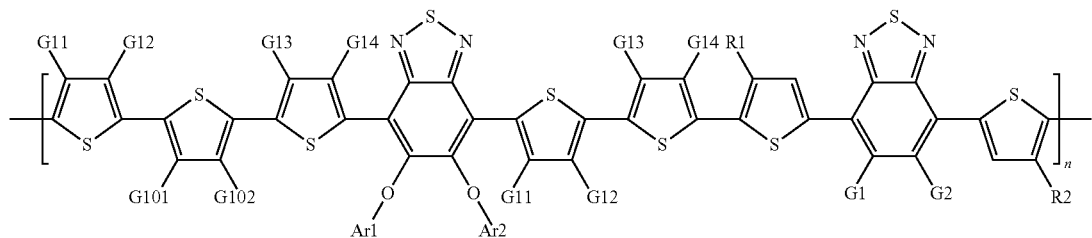
[Chemical Formula 4-6]
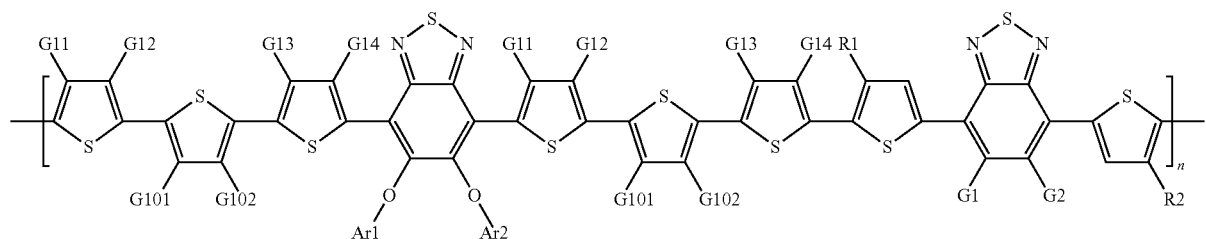
[Chemical Formula 4-7]
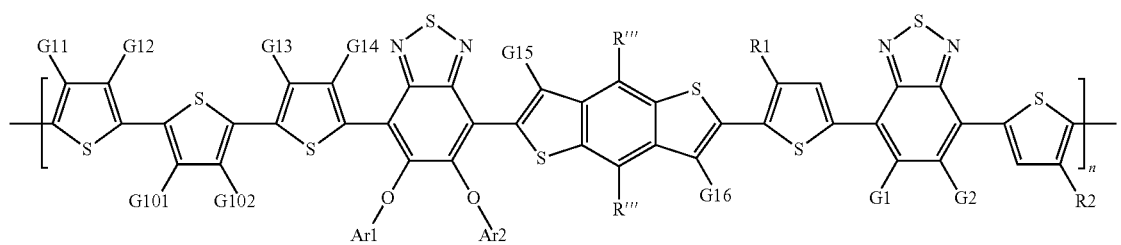

-continued
[Chemical Formula 4-8]
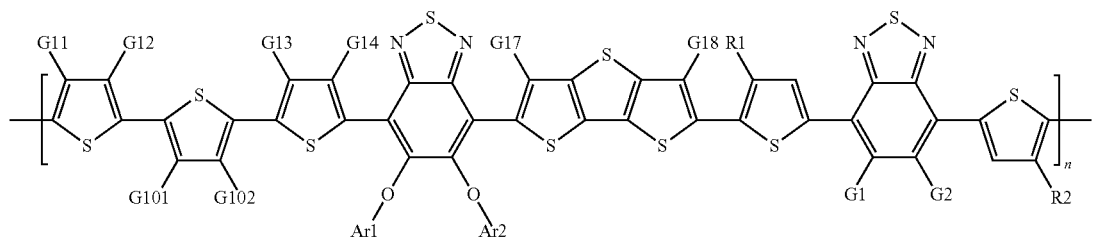
[Chemical Formula 4-9]
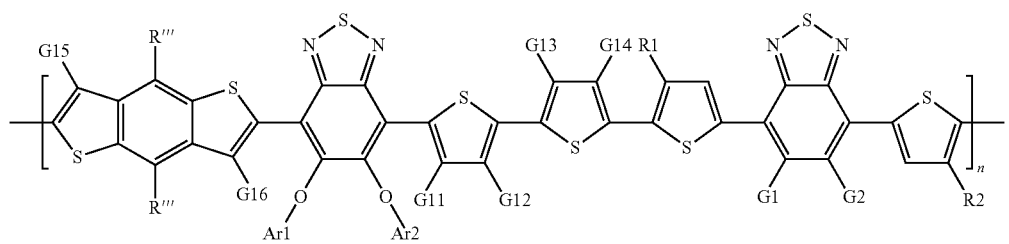
[Chemical Formula 4-10]
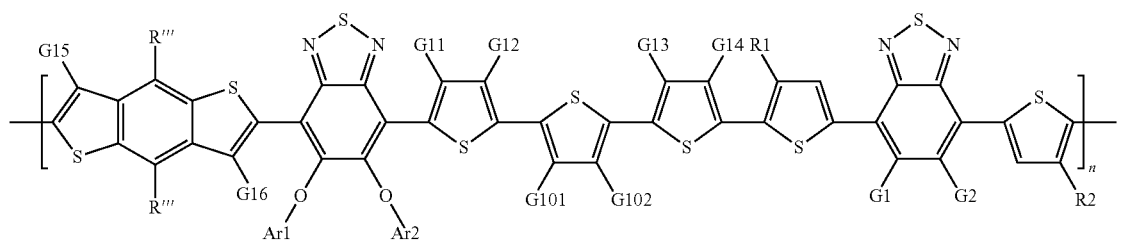
[Chemical Formula 4-11]
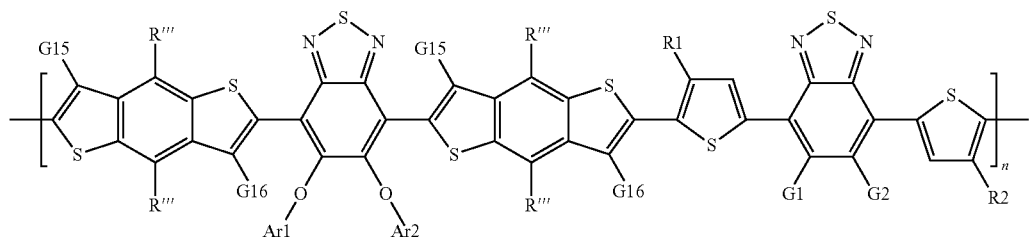
[Chemical Formula 4-12]
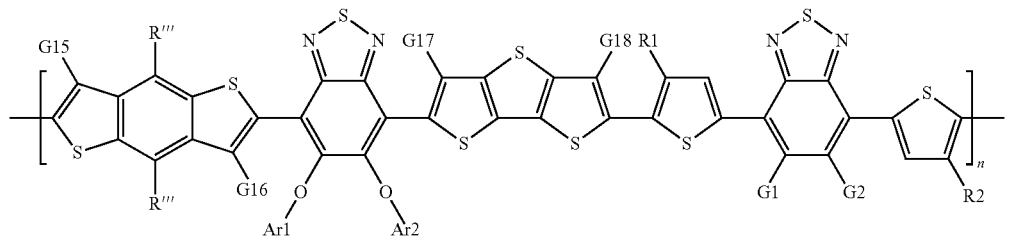
[Chemical Formula 4-13]
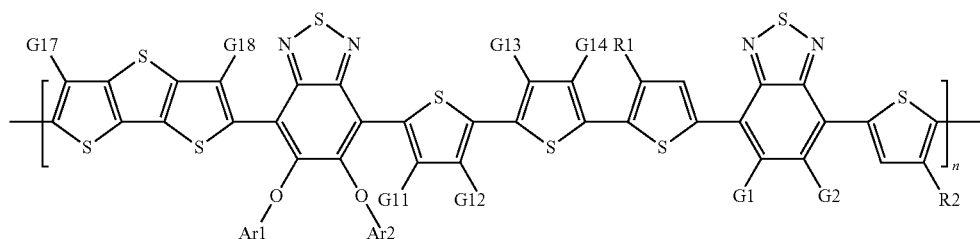

-continued
[Chemical Formula 4-14]
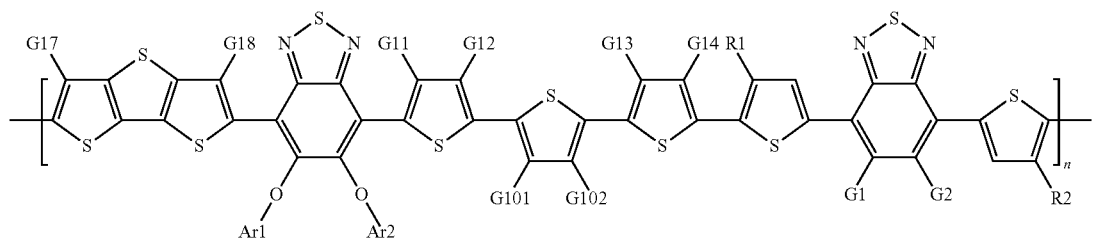
[Chemical Formula 4-15]
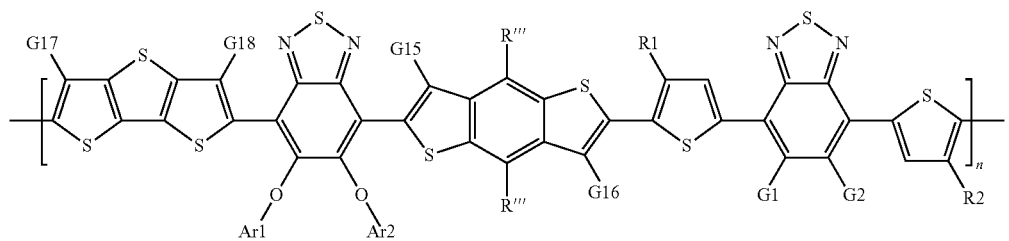
[Chemical Formula 4-16]
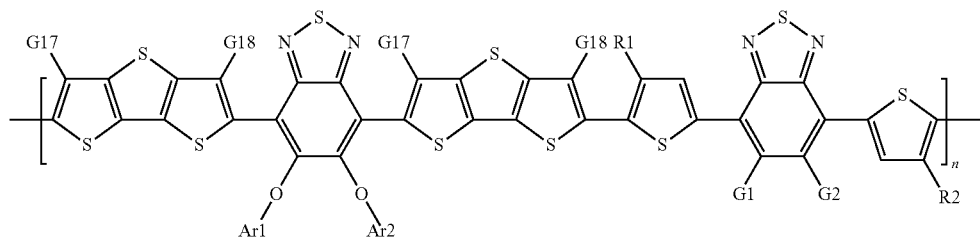
[Chemical Formula 5-1]
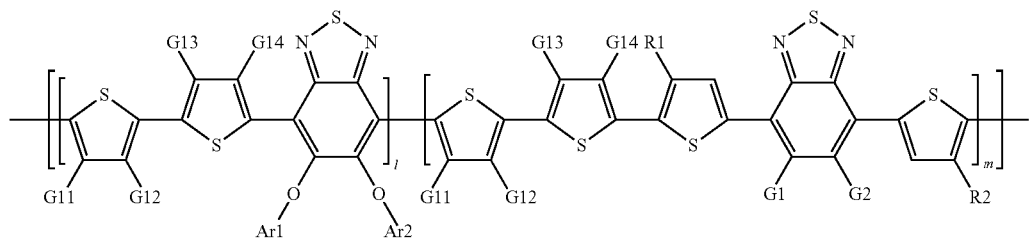
[Chemical Formula 5-2]
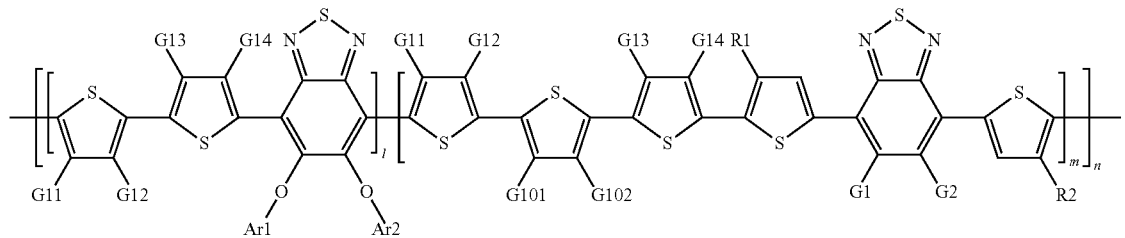
[Chemical Formula 5-3]
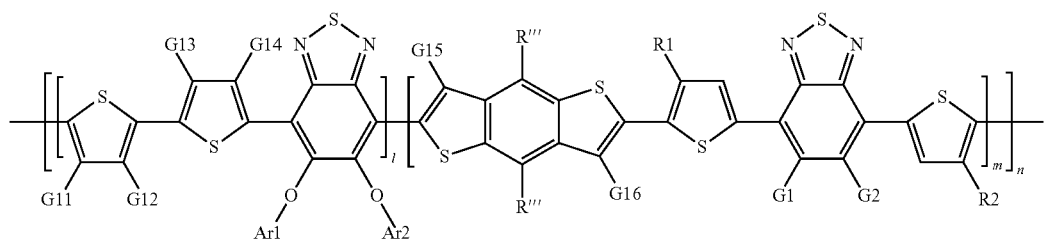

-continued
[Chemical Formula 5-4]
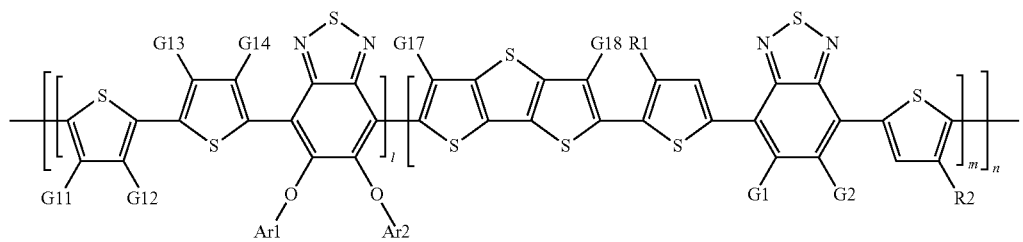
[Chemical Formula 5-5]
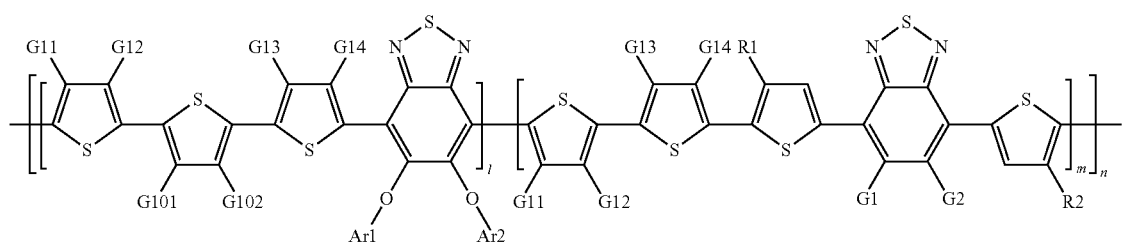
[Chemical Formula 5-6]
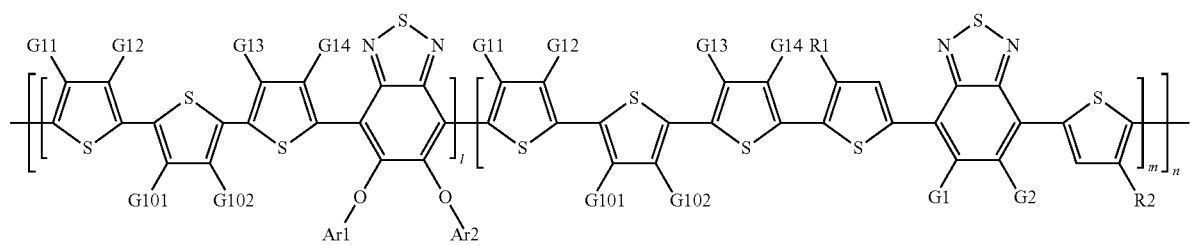
[Chemical Formula 5-7]
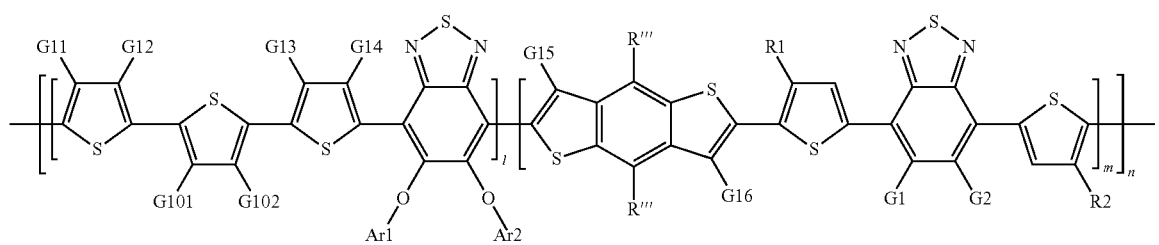
[Chemical Formula 5-8]
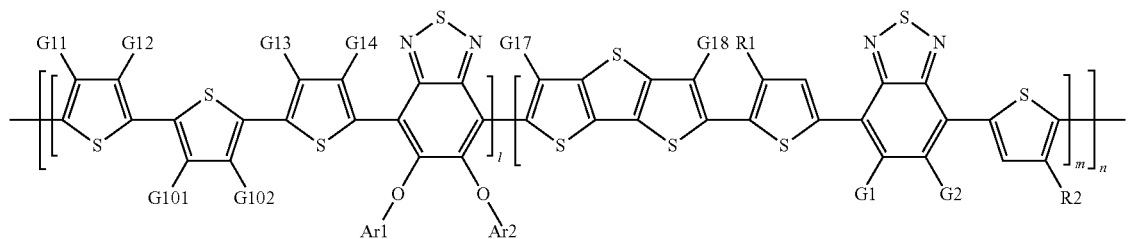
[Chemical Formula 5-9]
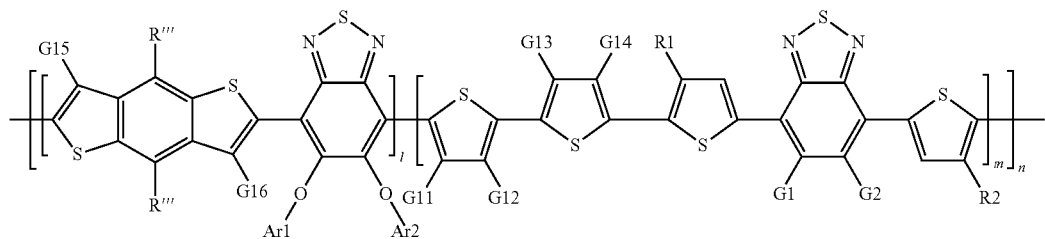

[Chemical Formula 5-10]
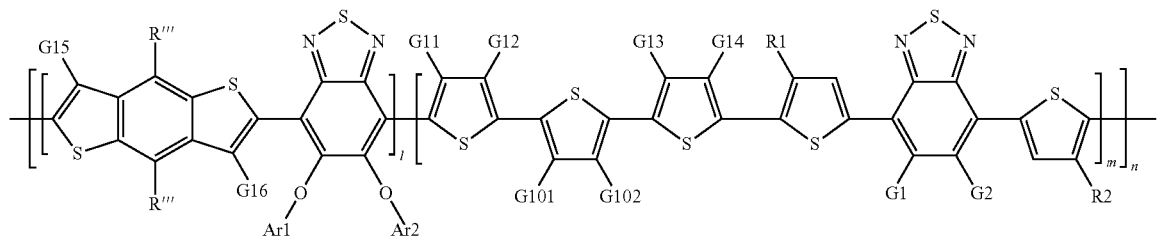
[Chemical Formula 5-11]
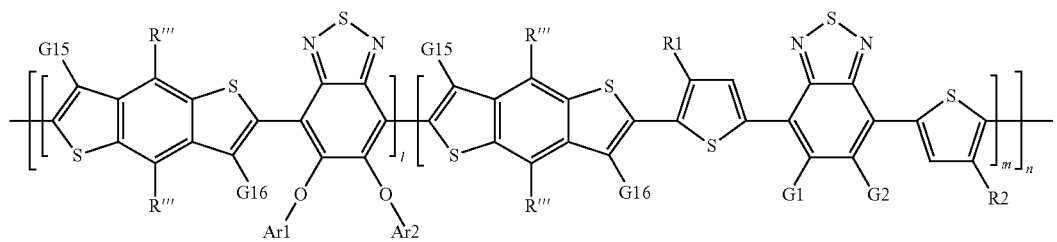
[Chemical Formula 5-12]
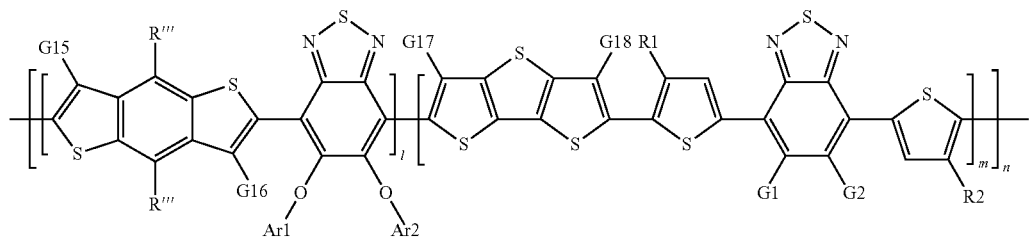
[Chemical Formula 5-13]
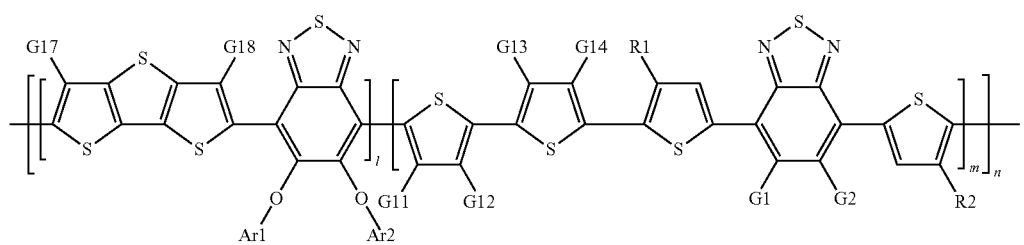
[Chemical Formula 5-14]
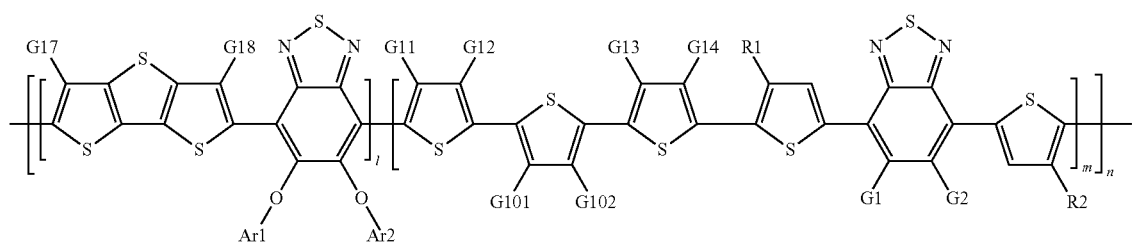

[Chemical Formula 5-15]

[Chemical Formula 5-16]

In Chemical Formulae 4-1 to 4-16 and 5-1 to 5-16, Ar1 and Ar2 are the same as those defined in Chemical Formula 1, R1, R2, G1, and G2 are the same as those defined in Chemical Formula 2, G11 to G18, G101, and G102 are the same as or different from each other, and are each independently hydrogen; or fluorine, R''' is hydrogen; deuterium; a halogen group; a hydroxy group; a substituted or unsubstituted alkyl group; a substituted or unsubstituted alkoxy group; a substituted or unsubstituted aryl group; or a substituted or unsubstituted heterocyclic group, l is a mole fraction and $0<l<1$, m is a mole fraction and $0<m<1$, l+m=1, and n is a repeating number of the unit, and an integer from 1 to 10,000.

According to an exemplary embodiment of the present specification, Ar1 and Ar2 are the same as or different from each other, and are each independently a straight or branched alkyl group.

According to an exemplary embodiment of the present specification, Ar1 and Ar2 are the same as or different from each other, and are each independently a straight or branched alkyl group having 1 to 30 carbon atoms.

According to an exemplary embodiment of the present specification, Ar1 and Ar2 are a substituted or unsubstituted dodecyl group.

According to an exemplary embodiment of the present specification, Ar1 and Ar2 are a dodecyl group.

According to an exemplary embodiment of the present specification, Ar1 is a dodecyl group.

According to an exemplary embodiment of the present specification, Ar2 is a dodecyl group.

According to an exemplary embodiment of the present specification, Ar1 is an n-dodecyl group.

According to an exemplary embodiment of the present specification, Ar2 is an n-dodecyl group.

According to an exemplary embodiment of the present specification, G1 and G2 are hydrogen.

According to an exemplary embodiment of the present specification, G1 and G2 are fluorine.

According to an exemplary embodiment of the present specification, G1 is hydrogen, and G2 is fluorine.

According to an exemplary embodiment of the present specification, G1 is fluorine, and G2 is hydrogen.

According to an exemplary embodiment of the present specification, R1 and R2 are the same as or different from each other, and are each independently a branched alkyl group.

According to an exemplary embodiment of the present specification, R1 and R2 are the same as or different from each other, and are each independently a branched alkyl group having 3 to 30 carbon atoms.

According to an exemplary embodiment of the present specification, R1 and R2 are a substituted or unsubstituted 2-decyltetradecyl group.

According to an exemplary embodiment of the present specification, R1 and R2 are a 2-decyltetradecyl group.

According to an exemplary embodiment of the present specification, R1 is a 2-decyltetradecyl group.

According to an exemplary embodiment of the present specification, R2 is a 2-decyltetradecyl group.

According to an exemplary embodiment of the present specification, G11 to G14 are the same as or different from each other, and are each independently hydrogen; or fluorine.

According to an exemplary embodiment of the present specification, two of G11 to G14 are fluorine, and the others are hydrogen.

According to an exemplary embodiment of the present specification, G12 and G13 are fluorine.

According to an exemplary embodiment of the present specification, G11 and G14 are hydrogen.

According to an exemplary embodiment of the present specification, G15 to G18, G101, and G102 are hydrogen.

According to an exemplary embodiment of the present specification, R''' is hydrogen.

In an exemplary embodiment of the present specification, the polymer includes a unit represented by any one of the following Chemical Formulae 5-1-1, 5-5-1, 5-11-1, and 5-16-1.

[Chemical Formula 5-1-1]

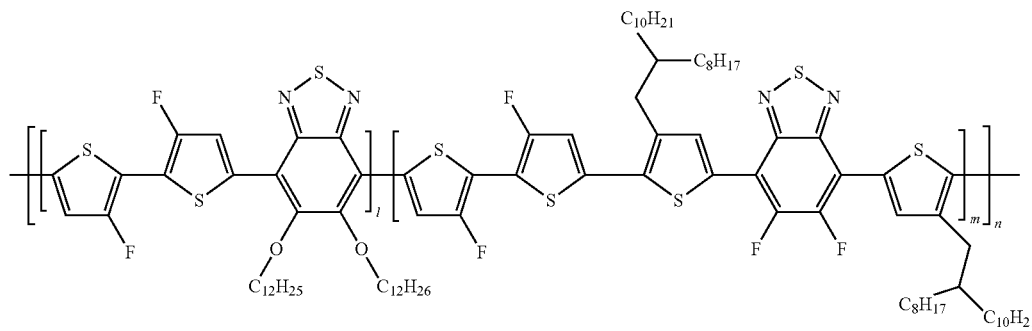

[Chemical Formula 5-5-1]

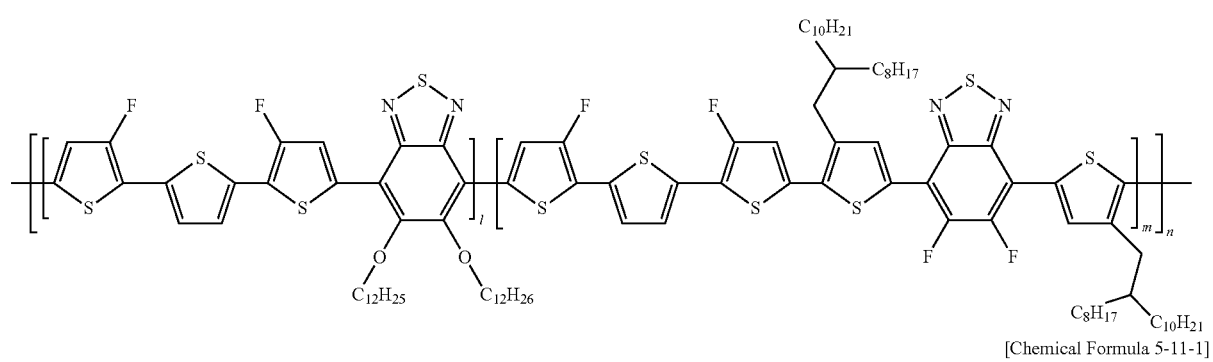

[Chemical Formula 5-11-1]

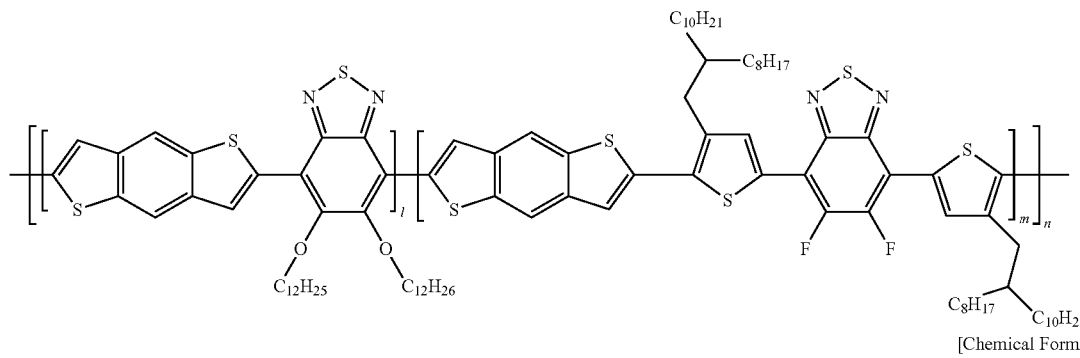

[Chemical Formula 5-16-1]

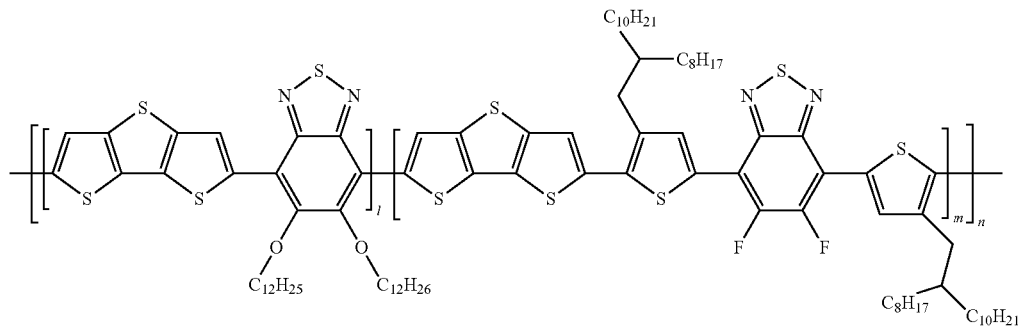

In Chemical Formulae 5-1-1, 5-5-1, 5-11-1, and 5-16-1,
l is a mole fraction and $0<l<1$,
m is a mole fraction and $0<m<1$,
$l+m=1$, and
n is a repeating number of the unit, and an integer from 1 to 10,000.

In an exemplary embodiment of the present specification, l is 0.5.

In an exemplary embodiment of the present specification, m is 0.5.

In an exemplary embodiment of the present specification, the HOMO energy level is 5 eV to 5.9 eV.

In the present specification, the HOMO energy level was measured by means of a cyclic voltammetry which is an electrochemical method, and the LUMO energy level was measured as a difference between the HOMO energy and the energy band gap emitted from the UV edge.

Specifically, the cyclic voltammetry is composed of a working electrode which is a carbon electrode, a reference electrode, and a counter electrode which is a platinum plate, and is a method which measures an electric current flowing in the electrodes while allowing the electric potential to fluctuate at a constant rate according to the time. The calculation equation of HOMO and LUMO is as follows.

$$\text{HOMO (or LUMO) (eV)} = -4.8 - (E_{onset} - E_{1/2}(\text{Ferrocene})) \quad \text{[Equation]}$$

In an exemplary embodiment of the present specification, the polymer has a solubility of 0.1 wt % to 20 wt % for chlorobenzene. The measurement of the solubility may mean a value measured at room temperature.

In one exemplary embodiment of the present specification, as an end group of the polymer, a trifluoro-benzene group and/or 4-bromodiphenyl ester are/is used, but in general, an end group publicly known may be modified and used according to the need of a person with ordinary skill in the art, and the end group is not limited.

According to an exemplary embodiment of the present specification, the polymer has a number average molecular weight of preferably 5,000 g/mol to 1,000,000 g/mol.

According to an exemplary embodiment of the present specification, the polymer may have a molecular weight distribution of 1 to 10. Preferably, the polymer has a molecular weight distribution of 1 to 3.

Further, the number average molecular weight is preferably 100,000 g/mol or less so that the polymer has predetermined or more solubility, and thus a solution application method is advantageously applied.

The polymer according to the present specification may be prepared by a multi-step chemical reaction. Monomers are prepared through an alkylation reaction, a Grignard reaction, a Suzuki coupling reaction, a Stille coupling reaction, and the like, and then final polymers may be prepared through a carbon-carbon coupling reaction such as a Stille coupling reaction. When a substituent to be introduced is a boronic acid or boronic ester compound, the final polymers may be prepared through a Suzuki coupling reaction, and when a substituent to be introduced is a tributyltin or trimethyltin compound, the final polymers may be prepared through a Stille coupling reaction, but the method is not limited thereto.

An exemplary embodiment of the present specification provides an organic solar cell including: a first electrode; a second electrode which is disposed to face the first electrode; and an organic material layer having one or more layers which is disposed between the first electrode and the second electrode and includes a photoactive layer, in which one or more layers of the organic material layer include the polymer.

When one member is disposed "on" another member in the present specification, this includes not only a case where the one member is brought into contact with another member, but also a case where still another member is present between the two members.

The organic solar cell according to an exemplary embodiment of the present specification includes a first electrode, a photoactive layer, and a second electrode. The organic solar cell may further include a substrate, a hole transporting layer, and/or an electron transporting layer.

In an exemplary embodiment of the present specification, when the organic solar cell accepts a photon from an external light source, an electron and a hole are generated between an electron donor and an electron acceptor. The generated hole is transported to a positive electrode through an electron donor layer.

In an exemplary embodiment of the present specification, the organic material layer includes a hole transporting layer, a hole injection layer, or a layer which simultaneously transports and injects holes, and the hole transporting layer, the hole injection layer, or the layer which simultaneously transports and injects holes includes the polymer.

In another exemplary embodiment, the organic material layer includes an electron injection layer, an electron transporting layer, or a layer which simultaneously injects and transports electrons, and the electron injection layer, the electron transporting layer, or the layer which simultaneously injects and transports electrons includes the polymer.

FIG. 1 is a view illustrating an organic solar cell according to an exemplary embodiment of the present specification.

In an exemplary embodiment of the present specification, when the organic solar cell accepts a photon from an external light source, an electron and a hole are generated between an electron donor and an electron acceptor. The generated hole is transported to a positive electrode through an electron donor layer.

In an exemplary embodiment of the present specification, the organic solar cell may further include an additional organic material layer. The organic solar cell may reduce the number of organic material layers by using an organic material which simultaneously has various functions.

In an exemplary embodiment of the present specification, the first electrode is an anode, and the second electrode is a cathode. In another exemplary embodiment, the first electrode is a cathode, and the second electrode is an anode.

In an exemplary embodiment of the present specification, in the organic solar cell, a cathode, a photoactive layer, and an anode may be arranged in this order, and an anode, a photoactive layer, and a cathode may be arranged in this order, but the arrangement order is not limited thereto.

In another exemplary embodiment, in the organic solar cell, an anode, a hole transporting layer, a photoactive layer, an electron transporting layer, and a cathode may also be arranged in this order, and a cathode, an electron transporting layer, a photoactive layer, a hole transporting layer, and an anode may also be arranged in this order, but the arrangement order is not limited thereto.

In an exemplary embodiment of the present specification, the organic solar cell has a normal structure. The normal structure may mean that an anode is formed on a substrate. Specifically, according to an exemplary embodiment of the present specification, when the organic solar cell has a normal structure, a first electrode to be formed on a substrate may be an anode.

In an exemplary embodiment of the present specification, the organic solar cell has an inverted structure. The inverted structure may mean that a cathode is formed on a substrate. Specifically, according to an exemplary embodiment of the present specification, when the organic solar cell has an inverted structure, a first electrode to be formed on a substrate may be a cathode.

In an exemplary embodiment of the present specification, the organic solar cell has a tandem structure. In this case, the organic solar cell may include a photoactive layer having two or more layers. In the organic solar cell according to an exemplary embodiment of the present specification, a photoactive layer may have one layer or two or more layers.

In another exemplary embodiment, a buffer layer may be disposed between a photoactive layer and a hole transporting layer, or between a photoactive layer and an electron transporting layer. In this case, a hole injection layer may be further disposed between an anode and a hole transporting layer. Further, an electron injection layer may be further disposed between a cathode and an electron transporting layer.

In an exemplary embodiment of the present specification, the photoactive layer includes one or two or more selected from the group consisting of an electron donor and an electron acceptor, and the electron donor includes the polymer.

In an exemplary embodiment of the present specification, the electron acceptor material may be selected from the group consisting of fullerene, fullerene derivatives, bathocuproine, semi-conducting elements, semi-conducting compounds, and combinations thereof. Specifically, the electron acceptor material is one or two or more compounds selected from the group consisting of fullerene, fullerene derivatives ((6,6)-phenyl-C61-butyric acid-methylester, or (6,6)-phenyl-C71-butyric acid-methylester) (PCBM), or (6,6)-phenyl-C61-butyric acid-cholesteryl ester (PCBCR)), perylene, polybenzimidazole (PBI), and 3,4,9,10-perylene-tetracarboxylic bis-benzimidazole (PTCBI).

In an exemplary embodiment of the present specification, the electron donor and the electron acceptor constitute a bulk heterojunction (BHJ).

The bulk heterojunction means that an electron donor material and an electron acceptor material are mixed with each other in a photoactive layer.

In an exemplary embodiment of the present specification, the photoactive layer further includes an additive.

In an exemplary embodiment of the present specification, the additive has a molecular weight of 50 g/mol to 1,000 g/mol.

In another exemplary embodiment, the additive is an organic material having a boiling point of 30° C. to 300° C. In the present specification, the organic material means a material including at least one or more carbon atoms.

In one exemplary embodiment, the additive may further include one or two additives among additives selected from the group consisting of 1,8-diiodooctane (DIO), 1-chloronaphthalene (1-CN), diphenylether (DPE), octane dithiol, and tetrabromothiophene.

For smoothly separating excitons from the organic solar cell and effectively transporting separated electric charges, the interface between the electron donor and the electron acceptor needs to be maximally increased, but it is required to induce an improvement in the morphology by securing a continuous channel of the electron donor and the electron acceptor through a suitable phase separation.

According to an exemplary embodiment of the present specification, an additive is introduced into an active layer, thereby inducing a selective solubility of a polymer and a fullerene derivative to the additive and an effective phase separation induced by a difference in a boiling point between the solvent and the additive. Further, the morphology is fixed by cross-linking an electron acceptor material or an electron donor material, so that the phase separation may be allowed not to occur, and the morphology may be controlled by changing the molecular structure of the electron donor material.

Additionally, the morphology may be improved by controlling the stereoregularity of the electron donor material, and the morphology may be improved through a post-treatment such as a heat treatment at high temperature. Through this, the orientation and crystallization of the polymer according to an exemplary embodiment of the present specification may be induced, and the contact with an electrode is facilitated by increasing the roughness of a photoactive layer, and as a result, an effective movement of electric charges may be induced.

In an exemplary embodiment of the present specification, the photoactive layer has a bilayer thin film structure including an n-type organic material layer and a p-type organic material layer, and the p-type organic material layer includes the polymer.

In the present specification, the substrate may be a glass substrate or a transparent plastic substrate having excellent transparency, surface smoothness, ease of handling, and waterproofing properties, but is not limited thereto, and the substrate is not limited as long as the substrate is typically used in the organic solar cell. Specific examples thereof include glass or polyethylene terephthalate (PET), polyethylene naphthalate (PEN), polypropylene (PP), polyimide (PI), triacetyl cellulose (TAC), and the like, but are not limited thereto.

The anode electrode may be made of a material which is transparent and has excellent conductivity, but is not limited thereto. Examples thereof include: a metal such as vanadium, chromium, copper, zinc, and gold, or an alloy thereof; a metal oxide such as zinc oxide, indium oxide, indium tin oxide (ITO), and indium zinc oxide (IZO); a combination of a metal and an oxide, such as ZnO:Al or SnO$_2$:Sb; a conductive polymer such as poly(3-methylthiophene), poly[3,4-(ethylene-1,2-dioxy)thiophene] (PEDOT), polypyrrole, and polyaniline, and the like, but are not limited thereto.

A method of forming the anode electrode is not particularly limited, but the anode electrode may be formed, for example, by being applied onto one surface of a substrate using sputtering, e-beam, thermal deposition, spin coating, screen printing, inkjet printing, doctor blade, or a gravure printing method, or by being coated in the form of a film.

When the anode electrode is formed on a substrate, the anode electrode may be subjected to processes of cleaning, removing moisture, and hydrophilic modification.

For example, a patterned ITO substrate is sequentially cleaned with a cleaning agent, acetone, and isopropyl alcohol (IPA), and then dried on a heating plate at 100° C. to 150° C. for 1 to 30 minutes, preferably at 120° C. for 10 minutes in order to remove moisture, and when the substrate is completely cleaned, the surface of the substrate is hydrophilically modified.

Through the surface modification as described above, the junction surface potential may be maintained at a level suitable for a surface potential of a photoactive layer. Further, during the modification, a polymer thin film may be easily formed on an anode electrode, and the quality of the thin film may also be improved.

Examples of a pre-treatment technology for an anode electrode include a) a surface oxidation method using a parallel plate-type discharge, b) a method of oxidizing a surface through ozone produced by using UV (ultraviolet) rays in a vacuum state, c) an oxidation method using oxygen radicals produced by plasma, and the like.

One of the methods may be selected depending on the state of an anode electrode or a substrate. However, even though any method is used, it is preferred to commonly prevent oxygen from leaving from the surface of the anode electrode or the substrate, and maximally suppress moisture and organic materials from remaining. In this case, it is possible to maximize a substantial effect of the pre-treatment.

As a specific example, it is possible to use a method of oxidizing a surface through the ozone produced by using UV. In this case, a patterned ITO substrate after being ultrasonically cleaned is baked on a hot plate and dried well, and then introduced into a chamber, and the patterned ITO substrate may be cleaned by the ozone generated by reacting an oxygen gas with UV light by operating a UV lamp.

However, the surface modification method of the patterned ITO substrate in the present specification need not be particularly limited, and any method may be used as long as the method is a method of oxidizing a substrate.

The cathode electrode may be a metal having a low work function, but is not limited thereto. Specific examples thereof include: a metal such as magnesium, calcium, sodium, potassium, titanium, indium, yttrium, lithium, gadolinium, aluminum, silver, tin, and lead, or an alloy thereof; and a multi-layer structured material such as LiF/Al, $LiO_2$/Al, LiF/Fe, Al:Li, Al:$BaF_2$, and Al:$BaF_2$:Ba, but are not limited thereto.

The cathode electrode may be deposited and formed in a thermal evaporator showing a vacuum degree of $5 \times 10^{-7}$ torr or less, but the forming method is not limited only to this method.

The hole transporting layer and/or electron transporting layer materials serve to efficiently transfer electrons and holes separated from a photoactive layer to an electrode, and the materials are not particularly limited.

include: metal complexes of 8-hydroxyquinoline; complexes including $Alq_3$; metal complexes including Liq; LiF; Ca; titanium oxide ($TiO_x$); zinc oxide (ZnO); and cesium carbonate ($Cs_2CO_3$), poly(ethylene imine) (PEI), and the like, but are not limited thereto.

The photoactive layer may be formed by dissolving a photoactive material such as an electron donor and/or an electron acceptor in an organic solvent, and then applying the solution by a method such as spin coating, dip coating, screen printing, spray coating, doctor blade, and brush painting, but the forming method is not limited thereto.

Hereinafter, the present specification will be described in detail with reference to Examples for specifically describing the present specification. However, the Examples according to the present specification may be modified in various forms, and it is not interpreted that the scope of the present specification is limited to the Examples described below in detail. The Examples of the present specification are provided to more completely explain the present specification to a person with ordinary skill in the art.

Preparation Example 1. Preparation of Polymer

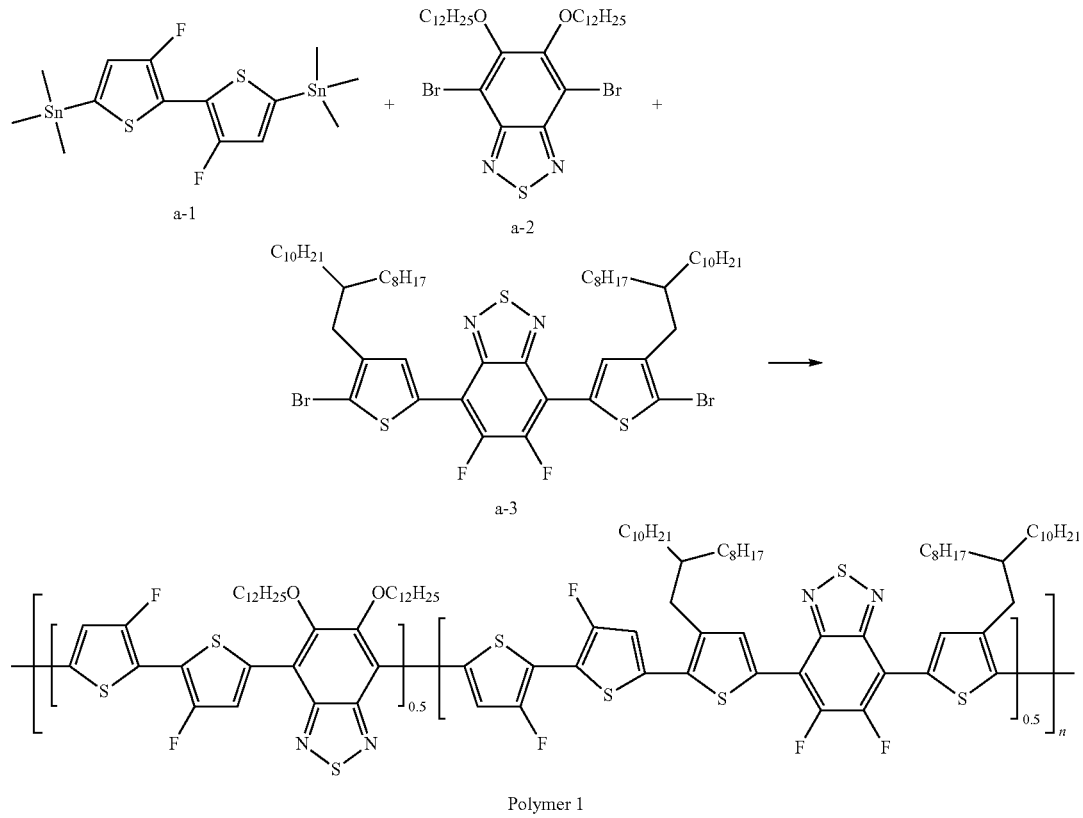

Polymer 1

The hole transporting layer material may be poly(3,4-ethylenedioxythiophene)-poly(styrenesulfonate) (PEDOT:PSS); molybdenum oxide ($MoO_x$); vanadium oxide ($V_2O_5$); nickel oxide (NiO); and tungsten oxide ($WO_x$); and the like, but is not limited thereto.

The electron transporting layer material may be electron-extracting metal oxides, and specific examples thereof Compounds a-1, a-2, and a-3, $Pd_2(dba)_3$ (3 mol %), and tri-(o-tolyl)phosphine (6 mol %) were added to a 5-ml microwave vial which was completely dried, and then 5 ml of anhydrous chlorobenzene was added thereto. A produced reaction mixture was heated at 130° C. in a microwave reactor for 100 minutes. After 0.5 ml of bromobenzotrifluoride was added to the solution, a resulting solution was further stirred for 20 minutes, and then cooled to room temperature. Thereafter, the mixture was poured into 100 ml of methanol. A precipitated polymer was obtained by filtration. The collected polymer was soxhlet extracted sequentially with methanol, acetone, hexane, and chloroform. After the chloroform extract was concentrated, the chloroform extract was poured into methanol and the polymer was precipitated. The precipitated polymer was obtained again by filtration and dried under vacuum overnight. Purified Polymer 1 (120 mg, 28%) having a violet-black gloss was obtained.

GPC Analysis: Mn=28,641 g/mol, PDI=1.98

FIG. 2 is a UV-vis absorption spectrum of a solution in which Polymer 1 was dissolved in chlorobenzene, FIG. 3 is a UV-vis absorption spectrum of a film sample prepared by dissolving Polymer 1 in chlorobenzene, in which the sample was analyzed by using a UV-Vis absorption spectrometer.

FIG. 4 is a cyclic voltammetry graph of Polymer 1. Further, the analysis results of Polymer 1 according to FIGS. 2 to 4 are shown in the following Table 1.

TABLE 1

| Mn/Mw/D (g/mol) | Solution $\lambda_{max, abs}$ (nm) | Film[a] $\lambda_{max}$ (nm) | $\lambda_{edge}$ (nm) | Optical $E_g^{opt}$ (eV)[a] | HOMO (eV)[a] CV | LUMO (eV)[a] CV |
|---|---|---|---|---|---|---|
| 28641/59751/1.98 | 678 | 667 | 723 | 1.71 | −5.36 | −3.65 |

In Table 1, $\lambda_{max}$, $\lambda_{edge}$, and Optical $E_g^{opt}$ mean a maximum absorption wavelength, an absorption edge, and an optical bandgap.

Experimental Example 1-1. Manufacture of Organic Solar Cell

A composite solution was prepared by dissolving Polymer 1 and $PC_{71}BM$ at a ratio of 1:1 in chlorobenzene (CB). In this case, the concentration was adjusted to 4 wt %, and the organic solar cell was made to have an inverted structure of ITO/ZnO NP/a photoactive layer/$MoO_3$/Ag.

A glass substrate (11.5Ω/□) coated with ITO with 1.5 cm×1.5 cm as a bar type was ultrasonically washed by using distilled water, acetone, and 2-propanol, the ITO surface was treated with ozone for 10 minutes, ZnO NP (2.5 wt % of ZnO nanograde N-10 in 1-butanol, filtered by a 0.45 μm PTFE) was prepared, the ZnO NP solution was spin-coated at 4,000 rpm for 40 seconds, and then the remaining solvent was removed by performing a heat treatment at 80° C. for 10 minutes, thereby completing an electron transporting layer. For the coating of a photoactive layer, the composite solution of Polymer 1 and $PC_{71}BM$ was spin-coated at 700 rpm at 70° C. for 25 seconds. In a thermal deposition apparatus, $MoO_3$ was thermally deposited to have a thickness of 10 nm at a rate of 0.2 Å/s under $10^{-7}$ Torr, thereby manufacturing a hole transporting layer. After the electron transporting layer and the hole transporting layer were manufactured in the above order, Ag was deposited to have a thickness of 100 nm at a rate of 1 Å/s in the thermal deposition apparatus, thereby manufacturing an organic solar cell having an inverted structure.

Experimental Example 1-2. Manufacture of Organic Solar Cell

An organic solar cell was manufactured in the same manner as in Experimental Example 1-1, except that the composite solution of Polymer 1 and $PC_{71}BM$ was spin-coated at 1,000 rpm instead of 700 rpm for the coating of the photoactive layer in Experimental Example 1-1.

Experimental Example 1-3. Manufacture of Organic Solar Cell

An organic solar cell was manufactured in the same manner as in Experimental Example 1-1, except that the composite solution of Polymer 1 and $PC_{71}BM$ was spin-coated at 1,500 rpm instead of 700 rpm for the coating of the photoactive layer in Experimental Example 1-1.

Experimental Example 1-4. Manufacture of Organic Solar Cell

An organic solar cell was manufactured in the same manner as in Experimental Example 1-1, except that the composite solution of Polymer 1 and $PC_{71}BM$ was spin-coated at 2,000 rpm instead of 700 rpm for the coating of the photoactive layer in Experimental Example 1-1.

The photoelectric conversion characteristics of the organic solar cells manufactured in Experimental Examples 1-1 to 1-4 were measured under the condition of 100 mW/cm² (AM 1.5), and the results are shown in the following Table 2.

TABLE 2

| | rpm | $V_{oc}$ (V) | $J_{sc}$ (mA/cm²) | FF | η (%) | Average η (%) |
|---|---|---|---|---|---|---|
| Experimental Example 1-1 | 700 | 0.833 | 9.898 | 0.402 | 3.32 | 3.33 |
| | | 0.833 | 9.752 | 0.410 | 3.33 | |
| Experimental Example 1-2 | 1000 | 0.833 | 9.795 | 0.361 | 2.94 | 3.27 |
| | | 0.831 | 10.016 | 0.433 | 3.60 | |
| Experimental Example 1-3 | 1500 | 0.779 | 10.872 | 0.447 | 3.79 | 3.93 |
| | | 0.834 | 10.737 | 0.454 | 4.06 | |
| Experimental Example 1-4 | 2000 | 0.839 | 10.900 | 0.468 | 4.28 | 4.27 |
| | | 0.839 | 10.535 | 0.481 | 4.25 | |

FIG. 5 is a view illustrating the current density according to the voltage in organic solar cells according to Experimental Examples 1-1 to 1-4.

Experimental Example 2-1. Manufacture of Organic Solar Cell

A composite solution was prepared by dissolving Polymer 1 and $PC_{71}BM$ at a ratio of 1:2 in chlorobenzene (CB). In this case, the concentration was adjusted to 4 wt %, and the organic solar cell was made to have an inverted structure of ITO/ZnO NP/a photoactive layer/$MoO_3$/Ag.

A glass substrate (11.5Ω/□) coated with ITO with 1.5 cm×1.5 cm as a bar type was ultrasonically washed by using distilled water, acetone, and 2-propanol, the ITO surface was treated with ozone for 10 minutes, ZnO NP (2.5 wt % of ZnO nanograde N-10 in 1-butanol, filtered by a 0.45 μm PTFE) was prepared, the ZnO NP solution was spin-coated at 4,000 rpm for 40 seconds, and then the remaining solvent was removed by performing a heat treatment at 80° C. for 10 minutes, thereby completing an electron transporting layer. For the coating of a photoactive layer, the composite solution of Polymer 1 and $PC_{71}BM$ was spin-coated at 700 rpm at 70° C. for 25 seconds. In a thermal deposition apparatus, $MoO_3$ was thermally deposited to have a thickness of 10 nm at a rate of 0.2 Å/s under $10^{-7}$ Torr, thereby manufacturing a hole transporting layer. After the electron transporting layer and the hole transporting layer were manufactured in the above order, Ag was deposited to have a thickness of 100 nm at a rate of 1 Å/s in the thermal deposition apparatus, thereby manufacturing an organic solar cell having an inverted structure.

Experimental Example 2-2. Manufacture of Organic Solar Cell

An organic solar cell was manufactured in the same manner as in Experimental Example 2-1, except that the composite solution of Polymer 1 and $PC_{71}BM$ was spin-coated at 1,000 rpm instead of 700 rpm for the coating of the photoactive layer in Experimental Example 2-1.

Experimental Example 2-3. Manufacture of Organic Solar Cell

An organic solar cell was manufactured in the same manner as in Experimental Example 2-1, except that the composite solution of Polymer 1 and $PC_{71}BM$ was spin-coated at 1,500 rpm instead of 700 rpm for the coating of the photoactive layer in Experimental Example 2-1.

Experimental Example 2-4. Manufacture of Organic Solar Cell

An organic solar cell was manufactured in the same manner as in Experimental Example 2-1, except that the composite solution of Polymer 1 and $PC_{71}BM$ was spin-coated at 2,000 rpm instead of 700 rpm for the coating of the photoactive layer in Experimental Example 2-1.

The photoelectric conversion characteristics of the organic solar cells manufactured in Experimental Examples 2-1 to 2-4 were measured under the condition of 100 $mW/cm^2$ (AM 1.5), and the results are shown in the following Table 3.

TABLE 3

|  | rpm | $V_{oc}$ (V) | $J_{sc}$ (mA/cm$^2$) | FF | η (%) | Average η (%) |
|---|---|---|---|---|---|---|
| Experimental Example 2-1 | 700 | 0.814 | 12.060 | 0.529 | 5.19 | 5.22 |
|  |  | 0.813 | 11.895 | 0.543 | 5.25 |  |
| Experimental Example 2-2 | 1000 | 0.820 | 11.985 | 0.563 | 5.53 | 5.57 |
|  |  | 0.817 | 11.760 | 0.583 | 5.61 |  |
| Experimental Example 2-3 | 1500 | 0.830 | 11.297 | 0.523 | 4.91 | 5.38 |
|  |  | 0.822 | 11.656 | 0.610 | 5.85 |  |
| Experimental Example 2-4 | 2000 | 0.827 | 10.134 | 0.575 | 4.81 | 4.93 |
|  |  | 0.825 | 10.312 | 0.593 | 5.04 |  |

FIG. 6 is a view illustrating the current density according to the voltage in organic solar cells according to Experimental Examples 2-1 to 2-4.

Experimental Example 3-1. Manufacture of Organic Solar Cell

An organic solar cell was manufactured in the same manner as in Experimental Example 1-1, except that the composite solution was prepared by dissolving Polymer 1 and $PC_{71}BM$ at a ratio of 1:3 instead of 1:1 in chlorobenzene (CB) in Experimental Example 1-1.

Experimental Example 3-2. Manufacture of Organic Solar Cell

An organic solar cell was manufactured in the same manner as in Experimental Example 1-2, except that the composite solution was prepared by dissolving Polymer 1 and $PC_{71}BM$ at a ratio of 1:3 instead of 1:1 in chlorobenzene (CB) in Experimental Example 1-2.

Experimental Example 3-3. Manufacture of Organic Solar Cell

An organic solar cell was manufactured in the same manner as in Experimental Example 1-3, except that the composite solution was prepared by dissolving Polymer 1 and $PC_{71}BM$ at a ratio of 1:3 instead of 1:1 in chlorobenzene (CB) in Experimental Example 1-3.

Experimental Example 3-4. Manufacture of Organic Solar Cell

An organic solar cell was manufactured in the same manner as in Experimental Example 1-4, except that the composite solution was prepared by dissolving Polymer 1 and $PC_{71}BM$ at a ratio of 1:3 instead of 1:1 in chlorobenzene (CB) in Experimental Example 1-4.

The photoelectric conversion characteristics of the organic solar cells manufactured in Experimental Examples 3-1 to 3-4 were measured under the condition of 100 $mW/cm^2$ (AM 1.5), and the results are shown in the following Table 4.

TABLE 4

|  | rpm | $V_{oc}$ (V) | $J_{sc}$ (mA/cm$^2$) | FF | η (%) | Average η (%) |
|---|---|---|---|---|---|---|
| Experimental Example 3-1 | 700 | 0.813 | 10.780 | 0.544 | 4.77 | 5.16 |
|  |  | 0.807 | 11.211 | 0.612 | 5.54 |  |
| Experimental Example 3-2 | 1000 | 0.812 | 10.840 | 0.646 | 5.69 | 5.69 |
|  |  | 0.811 | 10.647 | 0.658 | 5.68 |  |
| Experimental Example 3-3 | 1500 | 0.820 | 9.855 | 0.592 | 4.79 | 5.07 |
|  |  | 0.814 | 9.724 | 0.675 | 5.34 |  |
| Experimental Example 3-4 | 2000 | 0.815 | 8.299 | 0.617 | 4.18 | 4.26 |
|  |  | 0.810 | 8.333 | 0.643 | 4.34 |  |

FIG. 7 is a view illustrating the current density according to the voltage in organic solar cells according to Experimental Examples 3-1 to 3-4.

Experimental Example 4-1. Manufacture of Organic Solar Cell

An organic solar cell was manufactured in the same manner as in Experimental Example 2-1, except that the composite solution of Polymer 1 and $PC_{71}BM$ was prepared in an amount of 2 wt % instead of 4 wt % in Experimental Example 2-1.

Experimental Example 4-2. Manufacture of Organic Solar Cell

An organic solar cell was manufactured in the same manner as in Experimental Example 2-2, except that the composite solution of Polymer 1 and $PC_{71}BM$ was prepared in an amount of 2 wt % instead of 4 wt % in Experimental Example 2-2.

Experimental Example 4-3. Manufacture of Organic Solar Cell

An organic solar cell was manufactured in the same manner as in Experimental Example 2-3, except that the composite solution of Polymer 1 and PC$_{71}$BM was prepared in an amount of 2 wt % instead of 4 wt % in Experimental Example 2-3.

Experimental Example 4-4. Manufacture of Organic Solar Cell

An organic solar cell was manufactured in the same manner as in Experimental Example 2-4, except that the composite solution of Polymer 1 and PC$_{71}$BM was prepared in an amount of 2 wt % instead of 4 wt % in Experimental Example 2-4.

The photoelectric conversion characteristics of the organic solar cells manufactured in Experimental Examples 4-1 to 4-4 were measured under the condition of 100 mW/cm$^2$ (AM 1.5), and the results are shown in the following Table 5.

TABLE 5

|  | rpm | V$_{oc}$ (V) | J$_{sc}$ (mA/cm$^2$) | FF | η (%) | Average η (%) |
|---|---|---|---|---|---|---|
| Experimental Example 4-1 | 700 | 0.832 | 9.924 | 0.483 | 3.99 | 4.11 |
|  |  | 0.778 | 10.125 | 0.537 | 4.23 |  |
| Experimental Example 4-2 | 1000 | 0.819 | 9.570 | 0.580 | 4.55 | 4.43 |
|  |  | 0.817 | 9.283 | 0.568 | 4.31 |  |
| Experimental Example 4-3 | 1500 | 0.833 | 9.596 | 0.566 | 4.52 | 4.77 |
|  |  | 0.835 | 9.857 | 0.610 | 5.02 |  |
| Experimental Example 4-4 | 2000 | 0.774 | 9.258 | 0.538 | 3.86 | 4.18 |
|  |  | 0.845 | 9.321 | 0.572 | 4.50 |  |

FIG. 8 is a view illustrating the current density according to the voltage in organic solar cells according to Experimental Examples 4-1 to 4-4.

Experimental Example 5-1. Manufacture of Organic Solar Cell

An organic solar cell was manufactured in the same manner as in Experimental Example 2-1, except that 3 vol % of 1,8-diiodooctane (DIO) was added to the composite solution of Polymer 1 and PC$_{71}$BM in Experimental Example 2-1.

Experimental Example 5-2. Manufacture of Organic Solar Cell

An organic solar cell was manufactured in the same manner as in Experimental Example 2-2, except that 3 vol % of 1,8-diiodooctane (DIO) was added to the composite solution of Polymer 1 and PC$_{71}$BM in Experimental Example 2-2.

Experimental Example 5-3. Manufacture of Organic Solar Cell

An organic solar cell was manufactured in the same manner as in Experimental Example 2-3, except that 3 vol % of 1,8-diiodooctane (DIO) was added to the composite solution of Polymer 1 and PC$_{71}$BM in Experimental Example 2-3.

Experimental Example 5-4. Manufacture of Organic Solar Cell

An organic solar cell was manufactured in the same manner as in Experimental Example 2-4, except that 3 vol % of 1,8-diiodooctane (DIO) was added to the composite solution of Polymer 1 and PC$_{71}$BM in Experimental Example 2-4.

The photoelectric conversion characteristics of the organic solar cells manufactured in Experimental Examples 5-1 to 5-4 were measured under the condition of 100 mW/cm$^2$ (AM 1.5), and the results are shown in the following Table 6.

TABLE 6

|  | rpm | V$_{oc}$ (V) | J$_{sc}$ (mA/cm$^2$) | FF | η (%) | Average η (%) |
|---|---|---|---|---|---|---|
| Experimental Example 5-1 | 700 | 0.805 | 15.862 | 0.524 | 6.69 | 6.59 |
|  |  | 0.802 | 15.690 | 0.516 | 6.49 |  |
| Experimental Example 5-2 | 1000 | 0.813 | 15.266 | 0.611 | 7.59 | 7.49 |
|  |  | 0.810 | 15.007 | 0.607 | 7.38 |  |
| Experimental Example 5-3 | 1500 | 0.821 | 14.728 | 0.665 | 8.04 | 7.97 |
|  |  | 0.818 | 14.671 | 0.658 | 7.89 |  |
| Experimental Example 5-4 | 2000 | 0.829 | 13.532 | 0.660 | 7.40 | 7.54 |
|  |  | 0.823 | 13.666 | 0.682 | 7.67 |  |

FIG. 9 is a view illustrating the current density according to the voltage in organic solar cells according to Experimental Examples 5-1 to 5-4.

Experimental Example 6-1. Manufacture of Organic Solar Cell

An organic solar cell was manufactured in the same manner as in Experimental Example 2-1, except that 3 vol % of diphenylether (DPE) was added to the composite solution of Polymer 1 and PC$_{71}$BM in Experimental Example 2-1.

Experimental Example 6-2. Manufacture of Organic Solar Cell

An organic solar cell was manufactured in the same manner as in Experimental Example 2-2, except that 3 vol % of diphenylether (DPE) was added to the composite solution of Polymer 1 and PC$_{71}$BM in Experimental Example 2-2.

Experimental Example 6-3. Manufacture of Organic Solar Cell

An organic solar cell was manufactured in the same manner as in Experimental Example 2-3, except that 3 vol % of diphenylether (DPE) was added to the composite solution of Polymer 1 and PC$_{71}$BM in Experimental Example 2-3.

Experimental Example 6-4. Manufacture of Organic Solar Cell

An organic solar cell was manufactured in the same manner as in Experimental Example 2-4, except that 3 vol % of diphenylether (DPE) was added to the composite solution of Polymer 1 and PC$_{71}$BM in Experimental Example 2-4.

The photoelectric conversion characteristics of the organic solar cells manufactured in Experimental Examples 6-1 to 6-4 were measured under the condition of 100 mW/cm$^2$ (AM 1.5), and the results are shown in the following Table 7.

TABLE 7

| | rpm | $V_{oc}$ (V) | $J_{sc}$ (mA/cm$^2$) | FF | η (%) | Average η (%) |
|---|---|---|---|---|---|---|
| Experimental Example 6-1 | 700 | 0.796 | 15.534 | 0.468 | 5.78 | 5.77 |
| | | 0.792 | 15.447 | 0.471 | 5.76 | |
| Experimental Example 6-2 | 1000 | 0.806 | 15.246 | 0.577 | 7.10 | 7.14 |
| | | 0.803 | 15.222 | 0.586 | 7.17 | |
| Experimental Example 6-3 | 1500 | 0.816 | 15.116 | 0.650 | 8.01 | 8.06 |
| | | 0.813 | 15.383 | 0.649 | 8.11 | |
| Experimental Example 6-4 | 2000 | 0.818 | 14.044 | 0.673 | 7.74 | 7.68 |
| | | 0.816 | 13.861 | 0.672 | 7.61 | |

FIG. 10 is a view illustrating the current density according to the voltage in organic solar cells according to Experimental Examples 6-1 to 6-4.

Experimental Example 7-1. Manufacture of Organic Solar Cell

An organic solar cell was manufactured in the same manner as in Experimental Example 2-1, except that 3 vol % of 1-chloronaphthalene (1-CN) was added to the composite solution of Polymer 1 and PC$_{71}$BM in Experimental Example 2-1.

Experimental Example 7-2. Manufacture of Organic Solar Cell

An organic solar cell was manufactured in the same manner as in Experimental Example 2-2, except that 3 vol % of 1-chloronaphthalene (1-CN) was added to the composite solution of Polymer 1 and PC$_{71}$BM in Experimental Example 2-2.

Experimental Example 7-3. Manufacture of Organic Solar Cell

An organic solar cell was manufactured in the same manner as in Experimental Example 2-3, except that 3 vol % of 1-chloronaphthalene (1-CN) was added to the composite solution of Polymer 1 and PC$_{71}$BM in Experimental Example 2-3.

Experimental Example 7-4. Manufacture of Organic Solar Cell

An organic solar cell was manufactured in the same manner as in Experimental Example 2-4, except that 3 vol % of 1-chloronaphthalene (1-CN) was added to the composite solution of Polymer 1 and PC$_{71}$BM in Experimental Example 2-4.

The photoelectric conversion characteristics of the organic solar cells manufactured in Experimental Examples 7-1 to 7-4 were measured under the condition of 100 mW/cm$^2$ (AM 1.5), and the results are shown in the following Table 8.

TABLE 8

| | rpm | $V_{oc}$ (V) | $J_{sc}$ (mA/cm$^2$) | FF | η (%) | Average η (%) |
|---|---|---|---|---|---|---|
| Experimental Example 7-1 | 700 | 0.802 | 15.793 | 0.563 | 7.13 | 6.93 |
| | | 0.790 | 15.729 | 0.541 | 6.72 | |
| Experimental Example 7-2 | 1000 | 0.805 | 14.977 | 0.625 | 7.53 | 7.67 |
| | | 0.807 | 15.231 | 0.635 | 7.81 | |
| Experimental Example 7-3 | 1500 | 0.824 | 14.690 | 0.655 | 7.93 | 7.87 |
| | | 0.811 | 14.484 | 0.665 | 7.81 | |
| Experimental Example 7-4 | 2000 | 0.818 | 12.839 | 0.688 | 7.22 | 7.27 |
| | | 0.814 | 13.123 | 0.685 | 7.31 | |

FIG. 11 is a view illustrating the current density according to the voltage in organic solar cells according to Experimental Examples 7-1 to 7-4.

$V_{oc}$, $J_{sc}$, FF, and PCE (η) mean an open-circuit voltage, a short-circuit current, a fill factor, and energy conversion efficiency, respectively. The open-circuit voltage and the short-circuit current are an X axis intercept and an Y axis intercept, respectively, in the fourth quadrant of the voltage-current density curve, and as the two values are increased, the efficiency of the solar cell is preferably increased. In addition, the fill factor is a value obtained by dividing the area of a rectangle, which may be drawn within the curve, by the product of the short-circuit current and the open-circuit voltage. The energy conversion efficiency may be obtained when these three values are divided by the intensity of the irradiated light, and the higher value is preferred. From the results in Tables 2 to 8 and FIGS. 5 to 11, it can be confirmed that the polymer according to an exemplary embodiment of the present specification exhibit high photoelectric conversion efficiency.

EXPLANATION OF REFERENCE NUMERALS AND SYMBOLS

101: Substrate
102: First electrode
103: Hole transporting layer
104: Photoactive layer
105: Second electrode

What is claimed is:
1. A polymer comprising:
a first unit of Chemical Formula 1; and
a second unit of Chemical Formula 2:

[Chemical Formula 1]

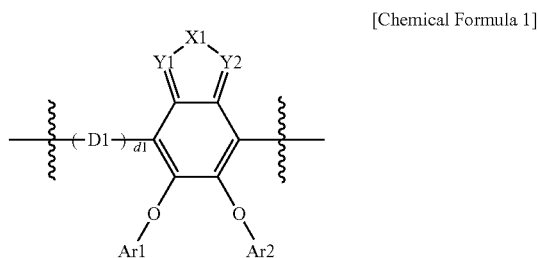

[Chemical Formula 2]

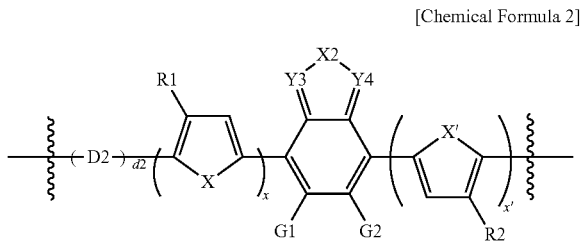

wherein:
d1, d2, x, and x' are each 1 or 2;
when d1, d2, x, and x' are each 2, structures in the parenthesis are the same as or different from each other;

X1 and X2 are the same as or different from each other, and are each independently CRR', NR, O, SiRR', PR, S, GeRR', Se or Te;

Y1 to Y4 are the same as or different from each other, and are each independently CR", N, SiR", P, or GeR";

X and X' are the same as or different from each other, and are each independently S or Se;

Ar1 and Ar2 are the same as or different from each other, and are each independently a substituted or unsubstituted straight or branched alkyl group;

R1 and R2 are the same as or different from each other, and are each independently a substituted or unsubstituted branched alkyl group;

G1 and G2 are the same as or different from each other, and are each independently hydrogen, or fluorine;

R, R', and R" are the same as or different from each other, and are each independently hydrogen, deuterium, a halogen group, a hydroxy group, a substituted or unsubstituted alkyl group, a substituted or unsubstituted alkoxy group, a substituted or unsubstituted aryl group, or a substituted or unsubstituted heterocyclic group; and D1 and D2 are the same as or different from each other, and are each independently any one selected from the following structures,

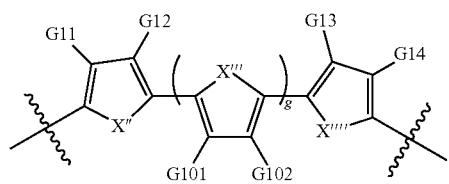
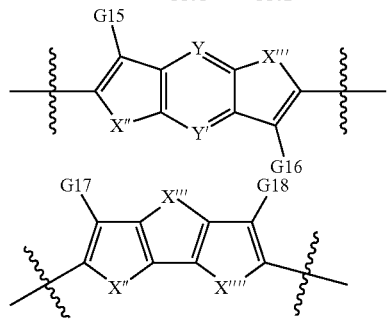

wherein:

X", X''', and X'''' are the same as or different from each other, and are each independently S or Se;

Y and Y' are the same as or different from each other, and are each independently CR''', N, SiR''', P, or Ge R''';

G11 to G18, G101, and G102 are the same as or different from each other, and are each independently hydrogen, or fluorine;

R''' is hydrogen, deuterium, a halogen group, a hydroxy group, a substituted or unsubstituted alkyl group, a substituted or unsubstituted alkoxy group, a substituted or unsubstituted aryl group, or a substituted or unsubstituted heterocyclic group; and g is 0 or 1.

2. The polymer of claim 1, wherein Chemical Formula 1 is Chemical Formula 1-1:

[Chemical Formula 1-1]

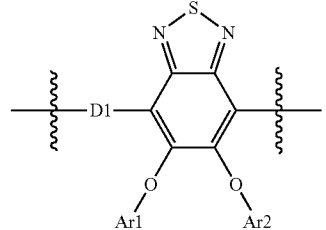

wherein Ar1, Ar2, and D1 are the same as those defined in Chemical Formula 1.

3. The polymer of claim 1, wherein Chemical Formula 2 is Chemical Formula 2-1:

[Chemical Formula 2-1]

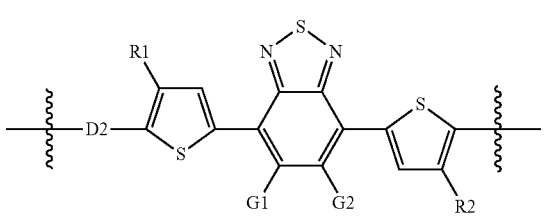

wherein R1, R2, G1, G2, and D2 are the same as those defined in Chemical Formula 2.

4. The polymer of claim 1, wherein Chemical Formula 1 is any one of Chemical Formulae 1-2 to 1-5:

[Chemical Formula 1-2]

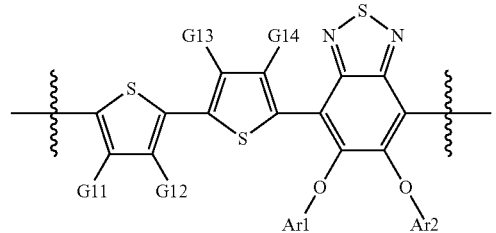

[Chemical Formula 1-3]

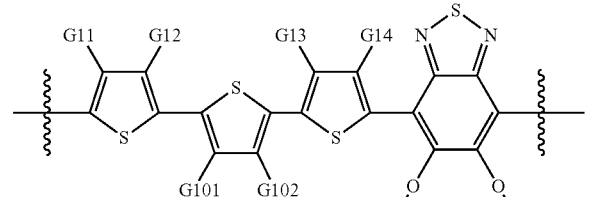

[Chemical Formula 1-4]

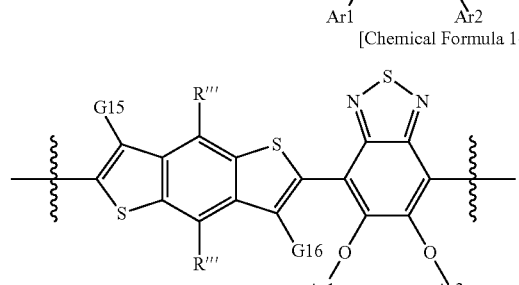

[Chemical Formula 1-5]

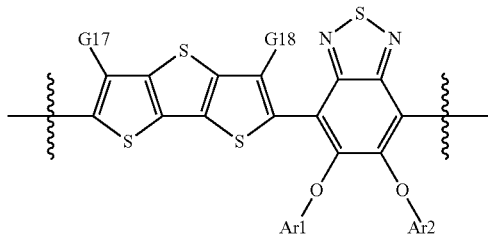

wherein:

Ar1 and Ar2 are the same as those defined in Chemical Formula 1;

G11 to G18, G101, and G102 are the same as or different from each other, and are each independently hydrogen, or fluorine; and R''' is hydrogen, deuterium, a halogen group, a hydroxy group, a substituted or unsubstituted alkyl group, a substituted or unsubstituted alkoxy group, a substituted or unsubstituted aryl group, or a substituted or unsubstituted heterocyclic group.

5. The polymer of claim 1, wherein Chemical Formula 2 is any one of Chemical Formulae 2-2 to 2-5:

[Chemical Formula 2-2]

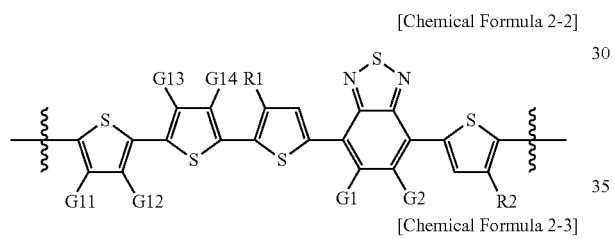

[Chemical Formula 2-3]

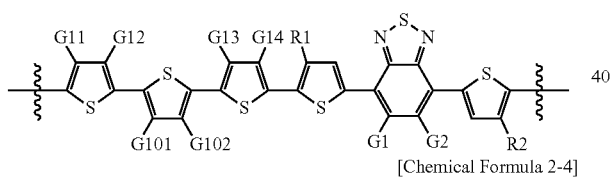

[Chemical Formula 2-4]

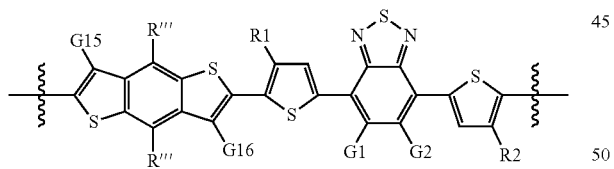

[Chemical Formula 2-5]

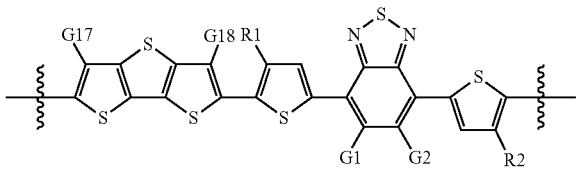

wherein:

R1, R2, G1, and G2 are the same as those defined in Chemical Formula 2;

G11 to G18, G101, and G102 are the same as or different from each other, and are each independently hydrogen, or fluorine; and R''' is hydrogen, deuterium, a halogen group, a hydroxy group, a substituted or unsubstituted alkyl group, a substituted or unsubstituted alkoxy group, a substituted or unsubstituted aryl group, or a substituted or unsubstituted heterocyclic group.

6. The polymer of claim 1, wherein the polymer comprises a unit of Chemical Formula 4 or 5:

[Chemical Formula 4]

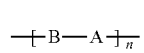

[Chemical Formula 5]

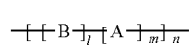

wherein:

A is Chemical Formula 1;

B is Chemical Formula 2;

l is a mole fraction and $0 < l < 1$;

m is a mole fraction and $0 < m < 1$;

$l + m = 1$; and n is a repeating number of the unit, and is an integer of from 1 to 10,000.

7. The polymer of claim 1, wherein the polymer comprises a unit of any one of Chemical Formulae 4-1 to 4-16 and 5-1 to 5-16:

[Chemical Formula 4-1]

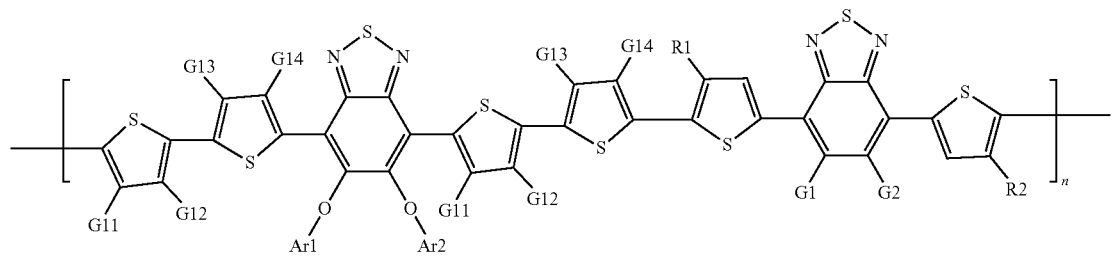

-continued
[Chemical Formula 4-2]
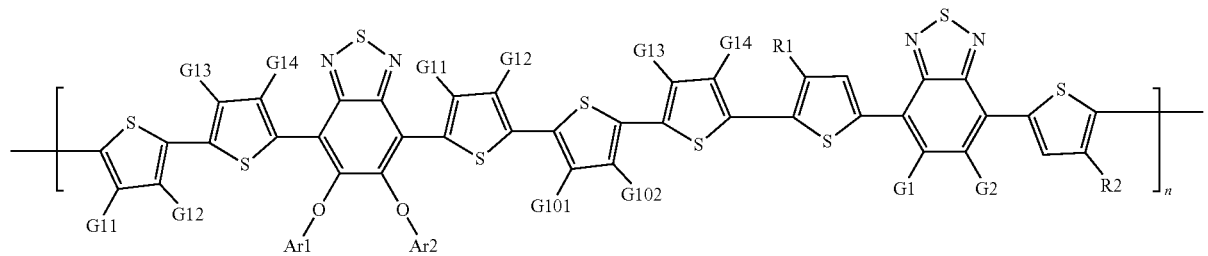
[Chemical Formula 4-3]
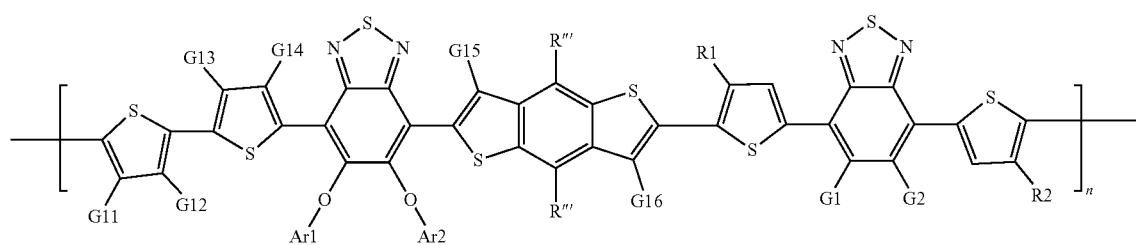
[Chemical Formula 4-4]
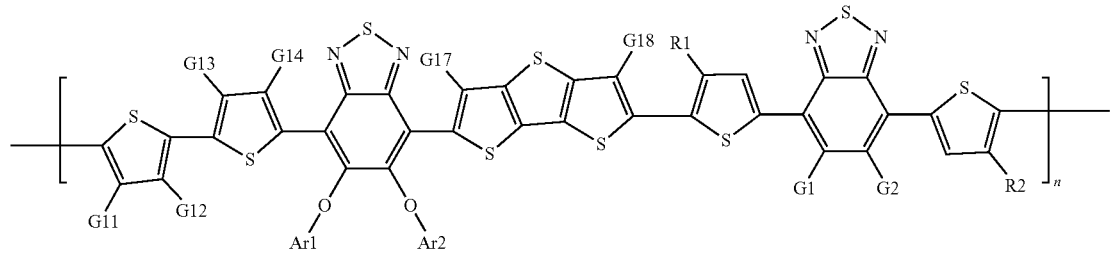
[Chemical Formula 4-5]
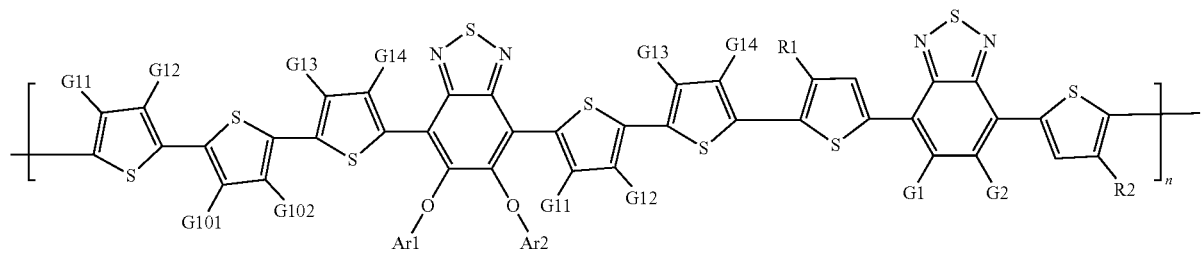
[Chemical Formula 4-6]
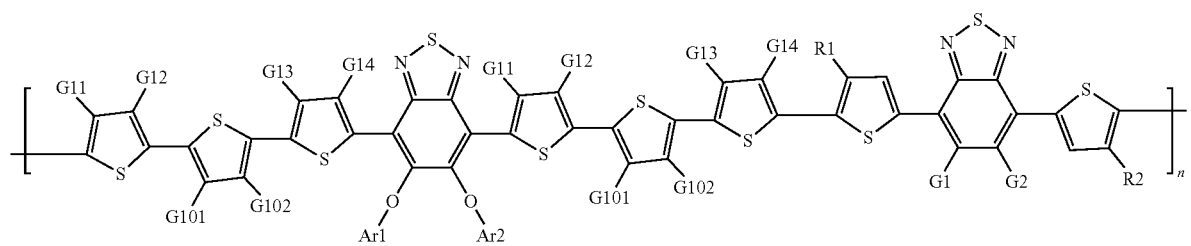
[Chemical Formula 4-7]
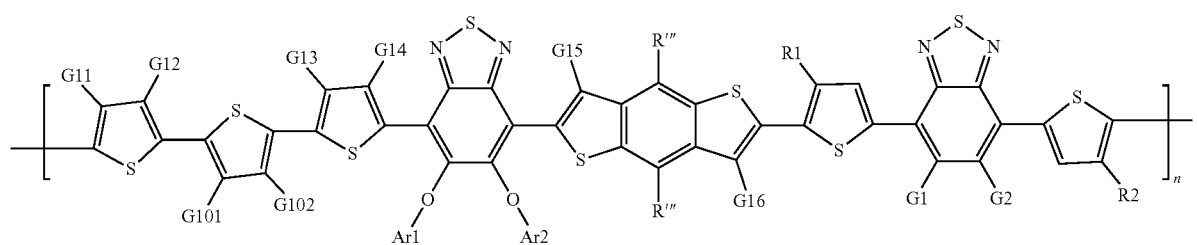

[Chemical Formula 4-8]
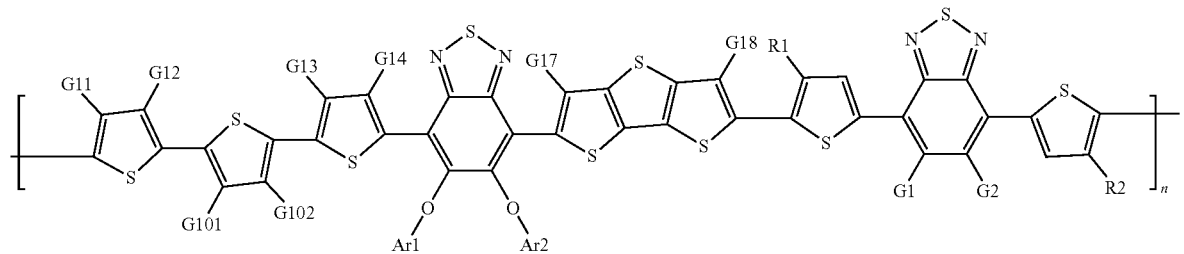
[Chemical Formula 4-9]
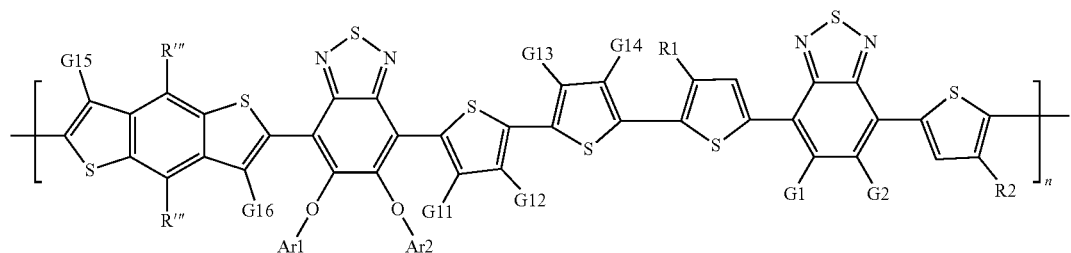
[Chemical Formula 4-10]
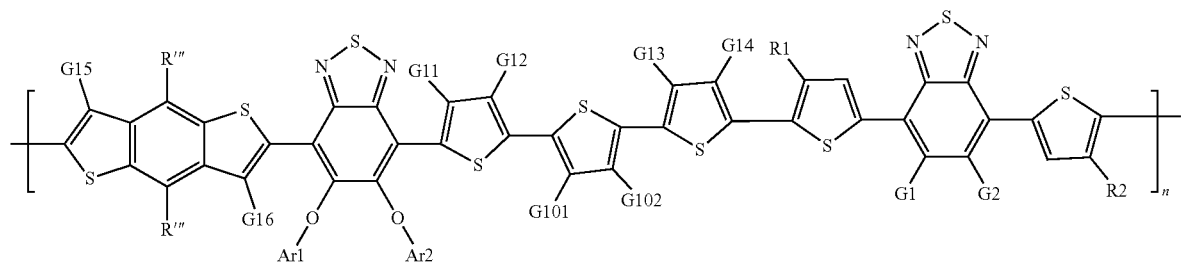
[Chemical Formula 4-11]
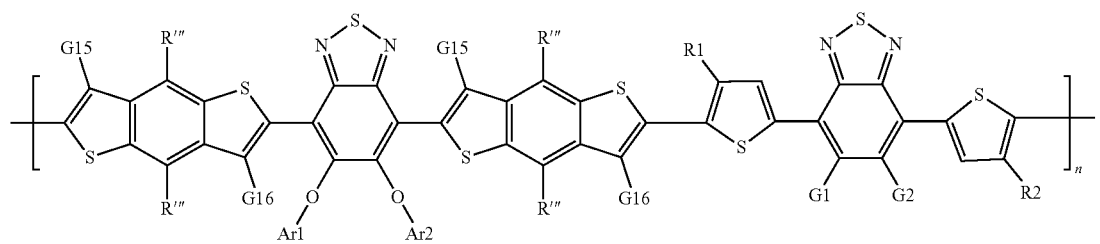
[Chemical Formula 4-12]
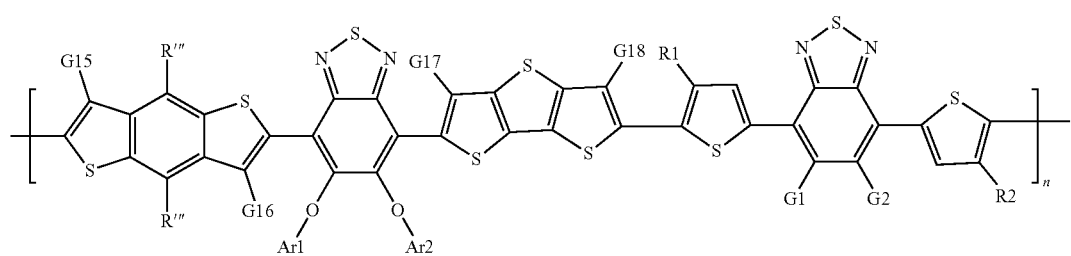

[Chemical Formula 4-13]
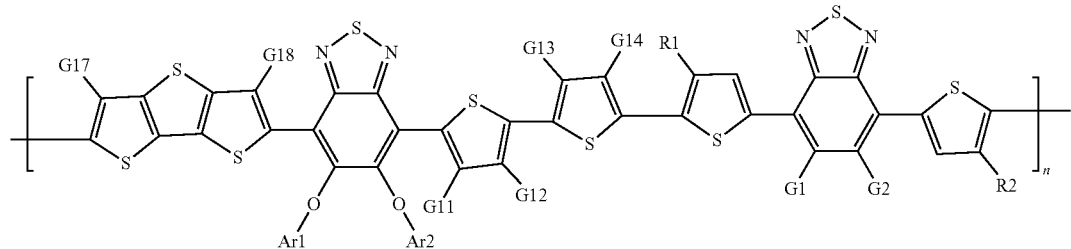
[Chemical Formula 4-14]
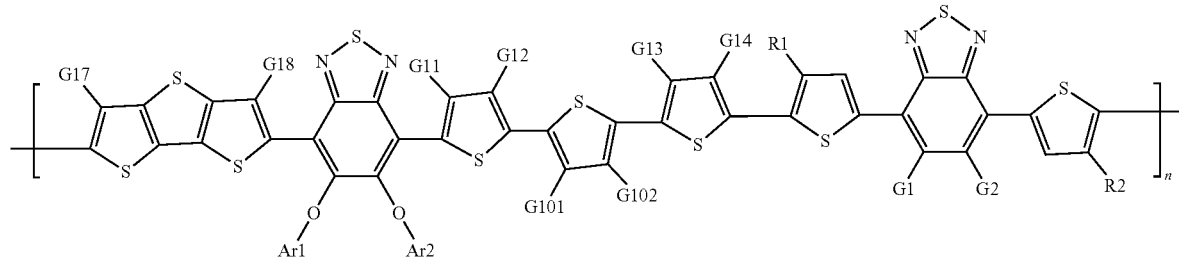
[Chemical Formula 4-15]
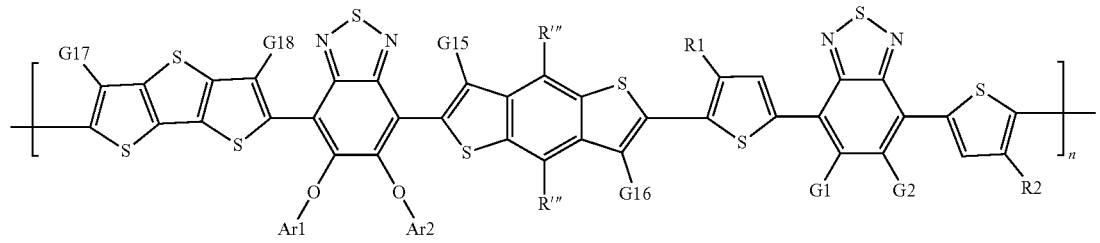
[Chemical Formula 4-16]
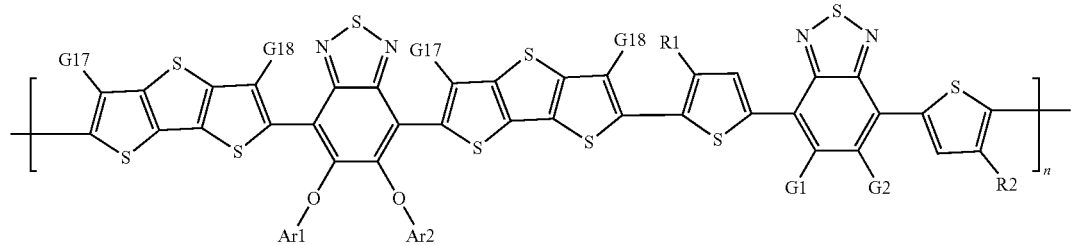
[Chemical Formula 5-1]
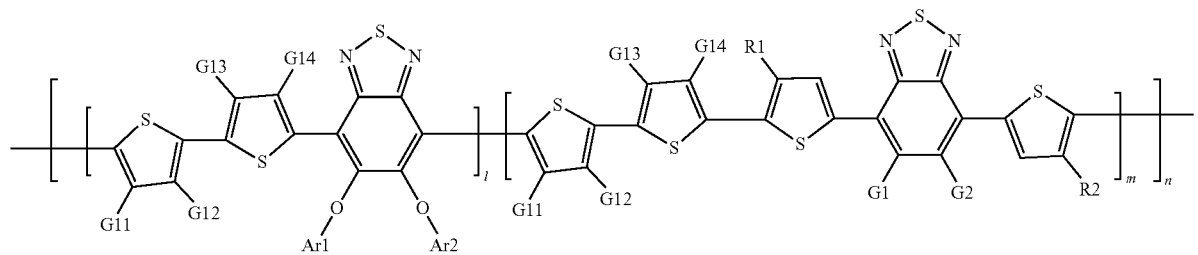
[Chemical Formula 5-2]
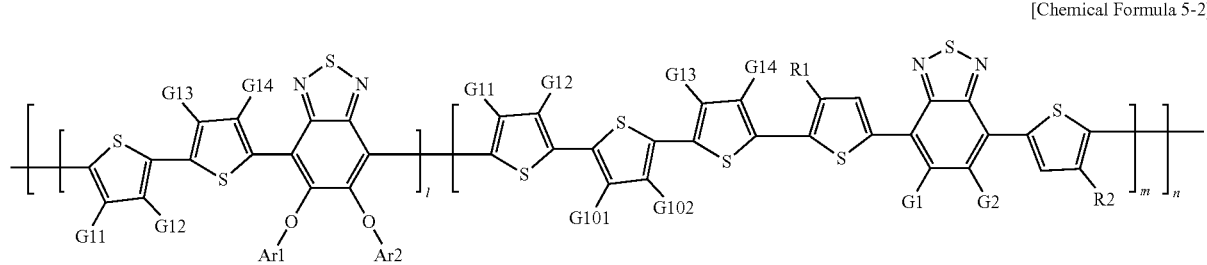

[Chemical Formula 5-3]
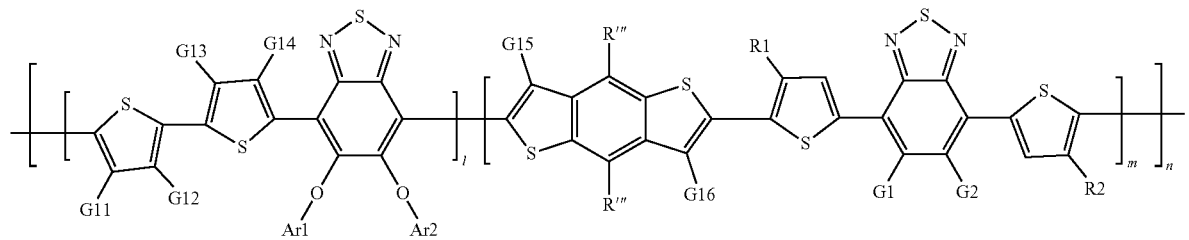
[Chemical Formula 5-4]
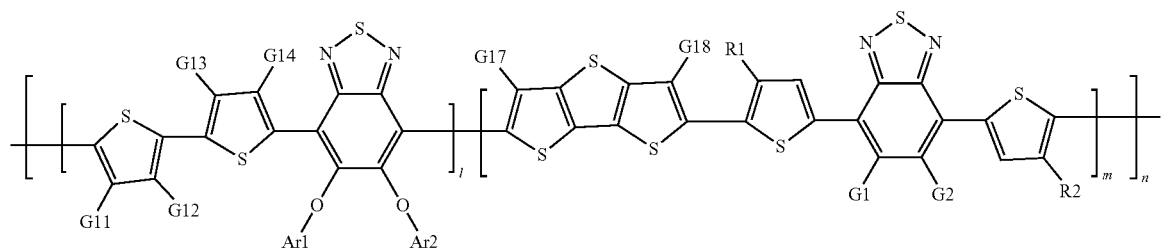
[Chemical Formula 5-5]
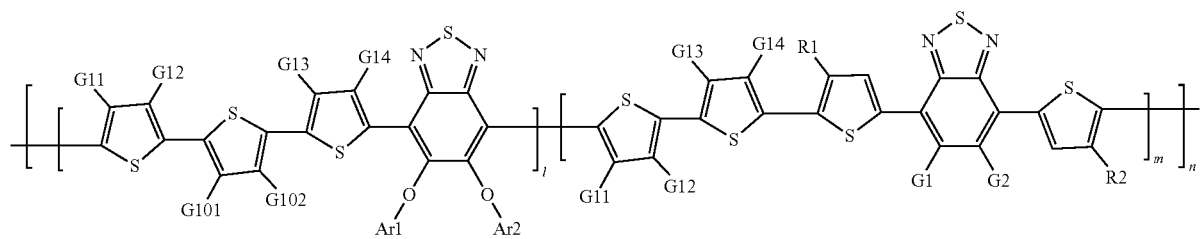
[Chemical Formula 5-6]
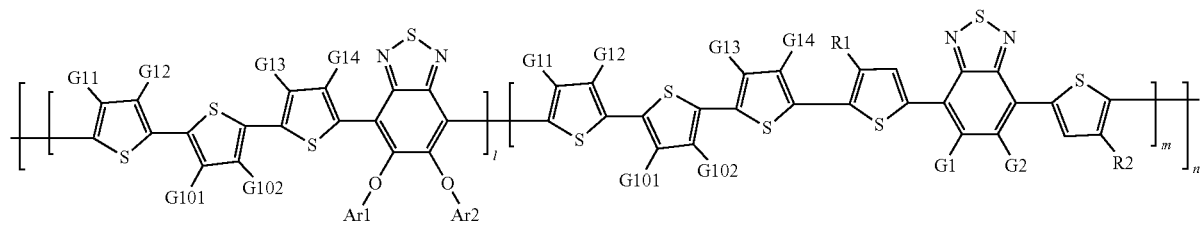
[Chemical Formula 5-7]
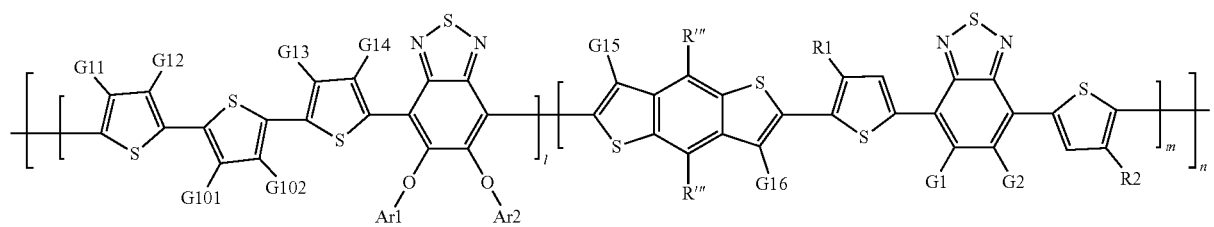
[Chemical Formula 5-8]
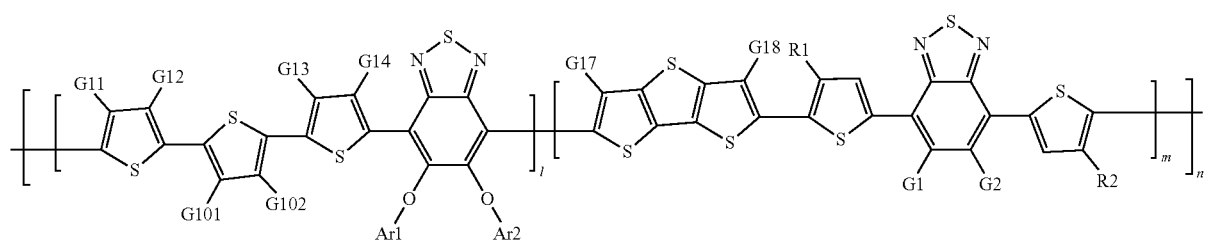

[Chemical Formula 5-9]
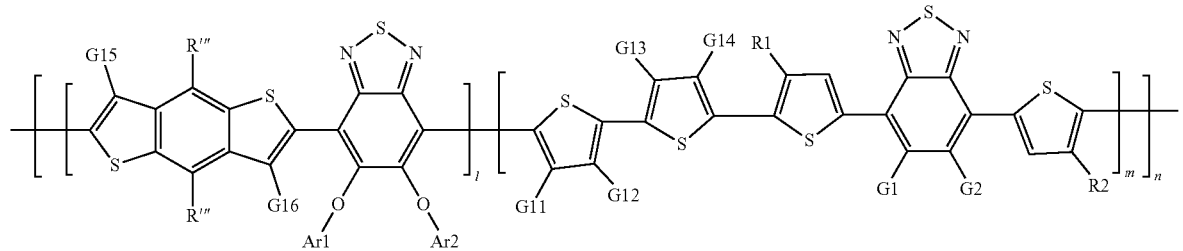
[Chemical Formula 5-10]
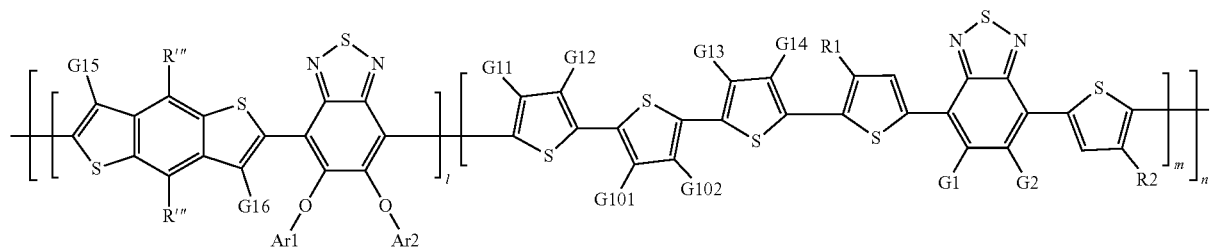
[Chemical Formula 5-11]
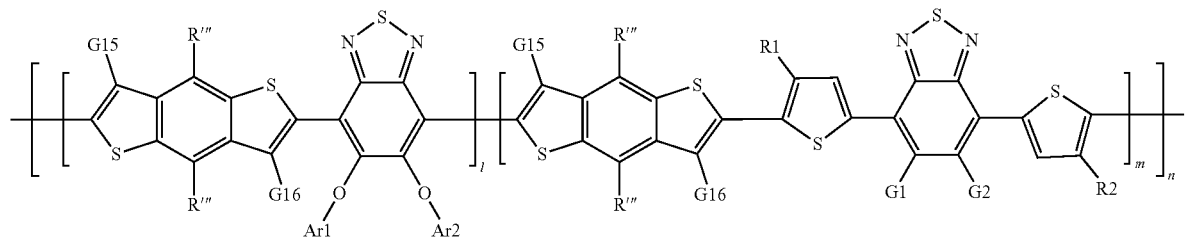
[Chemical Formula 5-12]
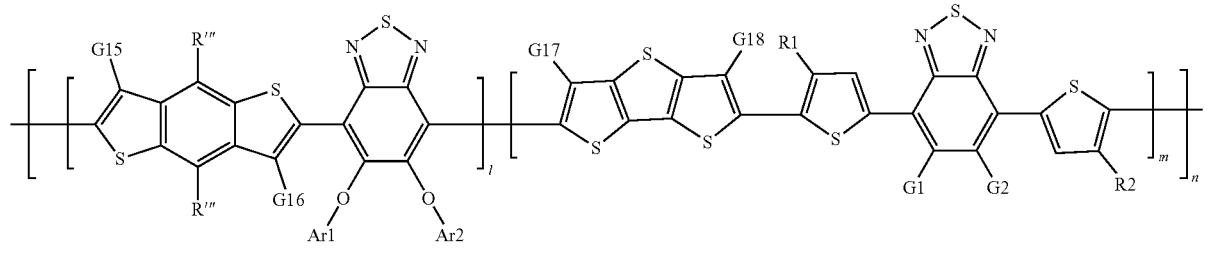
[Chemical Formula 5-13]
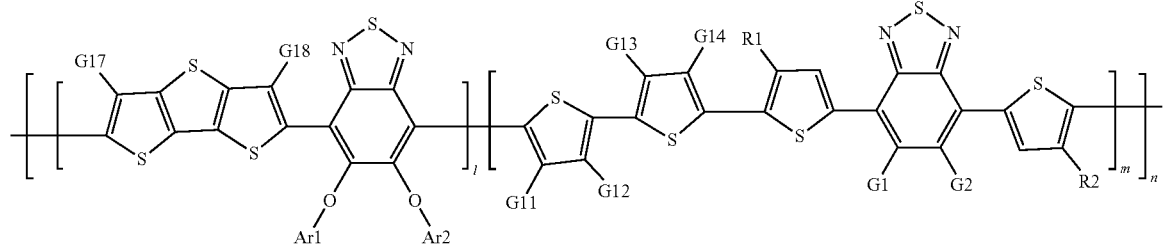
[Chemical Formula 5-14]
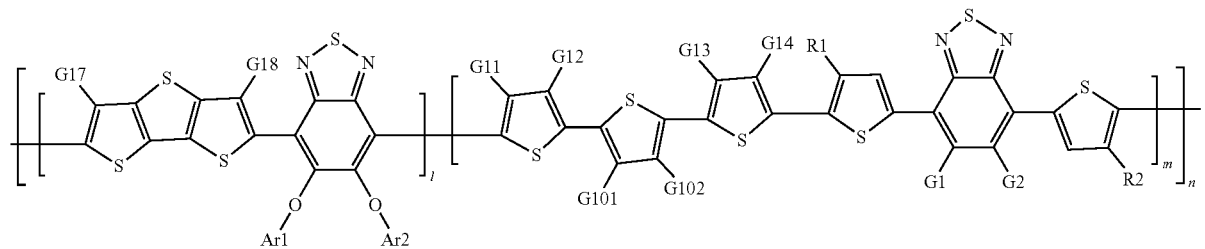

[Chemical Formula 5-15]

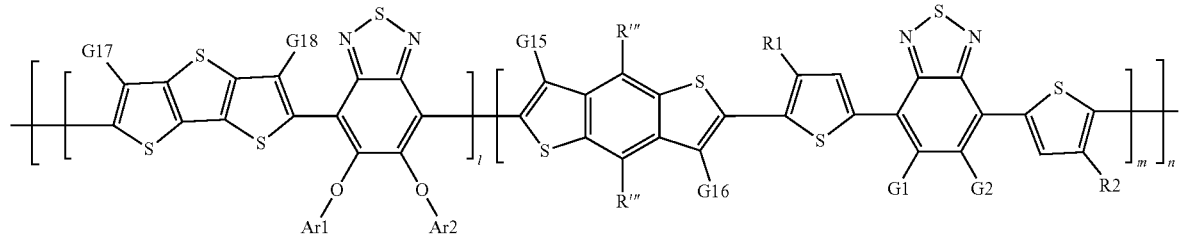

[Chemical Formula 5-16]

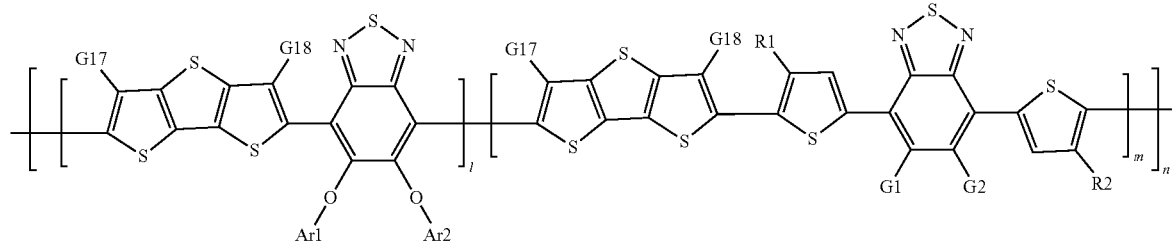

wherein:

Ar1 and Ar2 are the same as those defined in Chemical Formula 1;

R1, R2, G1, and G2 are the same as those defined in Chemical Formula 2;

G11 to G18, G101, and G102 are the same as or different from each other, and are each independently hydrogen, or fluorine;

R''' is hydrogen, deuterium, a halogen group, a hydroxy group, a substituted or unsubstituted alkyl group, a substituted or unsubstituted alkoxy group, a substituted or unsubstituted aryl group, or a substituted or unsubstituted heterocyclic group;

l is a mole fraction and 0<l<1;

m is a mole fraction and 0<m<1;

l+m=1; and n is a repeating number of the unit, and is an integer of from 1 to 10,000.

8. The polymer of claim 1, wherein the polymer comprises a unit of any one of Chemical Formulae 5-1-1, 5-5-1, 5-11-1, and 5-16-1:

[Chemical Formula 5-1-1]

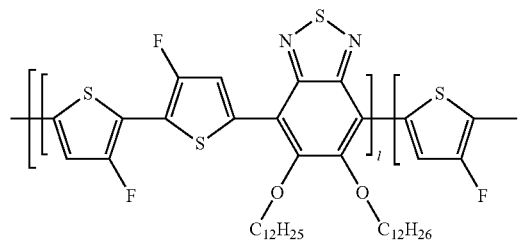

[Chemical Formula 5-5-1]

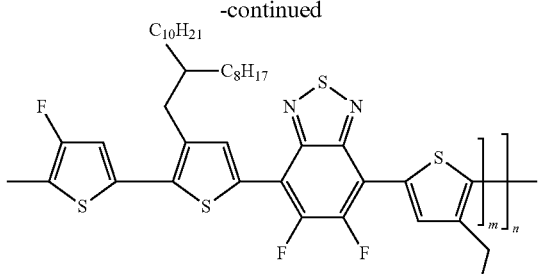

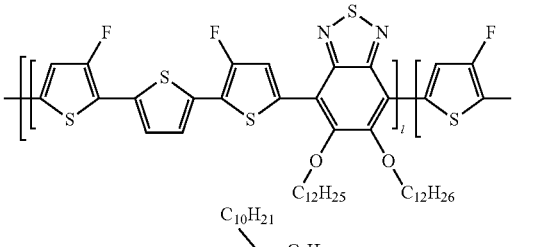

[Chemical Formula 5-11-1]

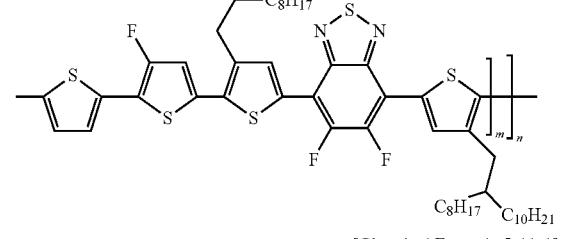

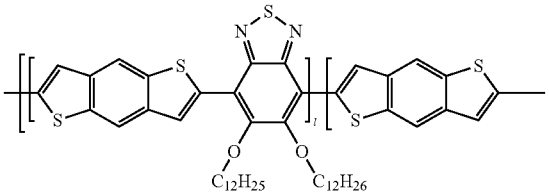

-continued

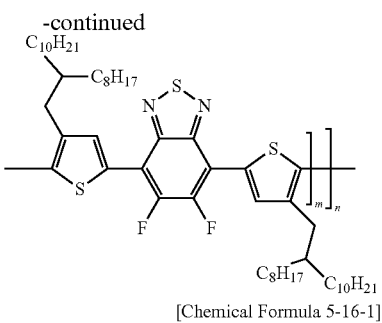

[Chemical Formula 5-16-1]

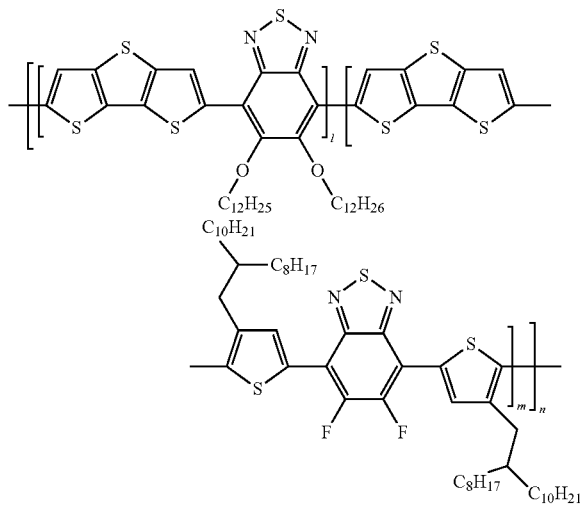

wherein:

l is a mole fraction and 0<l<1;

m is a mole fraction and 0<m<1;

l+m=1; and n is a repeating number of the unit, and is an integer of from 1 to 10,000.

9. The polymer of claim 1, wherein the polymer has a HOMO energy level of 5 eV to 5.9 eV.

10. The polymer of claim 1, wherein the polymer has a number average molecular weight of 5,000 g/mol to 1,000,000 g/mol.

11. The polymer of claim 1, wherein the polymer has a molecular weight distribution of 1 to 10.

12. An organic solar cell comprising:

a first electrode;

a second electrode facing the first electrode; and an organic material layer between the first electrode and the second electrode, the organic material layer comprising one or more layers and comprising a photoactive layer, wherein the one or more layers of the organic material layer comprise the polymer of claim 1.

13. The organic solar cell of claim 12, wherein the photoactive layer comprises one or more selected from the group consisting of an electron donor and an electron acceptor, and wherein the electron donor comprises the polymer of claim 1.

14. The organic solar cell of claim 13, wherein the electron donor and the electron acceptor are both present and constitute a bulk heterojunction (BHJ).

15. The organic solar cell of claim 13, wherein the photoactive layer further comprises an additive.

16. The organic solar cell of claim 12, wherein the photoactive layer has a bilayer thin film structure comprising an n-type organic material layer and a p-type organic material layer, and wherein the p-type organic material layer comprises the polymer of claim 1.

17. The organic solar cell of claim 15, wherein the additive comprises one or two additives selected from the group consisting of 1,8-diiodooctane (DIO), 1-chloronaphthalene (1-CN), diphenylether (DPE), octane dithiol, and tetrabromothiophene.

18. The organic solar cell of claim 15, wherein the additive comprises an organic material having a boiling point of 30° C. to 300° C.

19. The polymer of claim 1, wherein the polymer has a number average molecular weight of 100,000 g/mol or less.

20. The polymer of claim 1, wherein the polymer has a molecular weight distribution of 1 to 3.

* * * * *

UNITED STATES PATENT AND TRADEMARK OFFICE
CERTIFICATE OF CORRECTION

PATENT NO. : 10,629,816 B2
APPLICATION NO. : 16/339665
DATED : April 21, 2020
INVENTOR(S) : Kim et al.

Page 1 of 2

It is certified that error appears in the above-identified patent and that said Letters Patent is hereby corrected as shown below:

In the Claims

Claim 7:

Column 50, top and center of Formula 4-3: Please correct "R″ ′" to read -- R‴ --

Column 50, bottom and center of Formula 4-3: Please correct "R″ ′" to read -- R‴ --

Column 50, top and center of Formula 4-7: Please correct "R″ ′" to read -- R‴ --

Column 50, bottom and center of Formula 4-7: Please correct "R″ ′" to read -- R‴ --

Column 51, top and left of Formula 4-9: Please correct "R″ ′" to read -- R‴ --

Column 51, bottom and left of Formula 4-9: Please correct "R″ ′" to read -- R‴ --

Column 51, top and left of Formula 4-10: Please correct "R″ ′" to read -- R‴ --

Column 51, bottom and left of Formula 4-10: Please correct "R″ ′" to read -- R‴ --

Column 51, top and left of Formula 4-11: Please correct "R″ ′" to read -- R‴ --

Column 51, bottom and left of Formula 4-11: Please correct "R″ ′" to read -- R‴ --

Column 51, top and left of Formula 4-12: Please correct "R″ ′" to read -- R‴ --

Column 51, bottom and left of Formula 4-12: Please correct "R″ ′" to read -- R‴ --

Column 53, top and center of Formula 4-15: Please correct "R″ ′" to read -- R‴ --

Signed and Sealed this
Twenty-second Day of September, 2020

Andrei Iancu
*Director of the United States Patent and Trademark Office*

CERTIFICATE OF CORRECTION (continued)
U.S. Pat. No. 10,629,816 B2

Column 53, bottom and center of Formula 4-15: Please correct "R″ ′" to read -- R‴ --

Column 55, top and center of Formula 5-3: Please correct "R″ ′" to read -- R‴ --

Column 55, bottom and center of Formula 5-3: Please correct "R″ ′" to read -- R‴ --

Column 56, top and center of Formula 5-7: Please correct "R″ ′" to read -- R‴ --

Column 56, bottom and center of Formula 5-7: Please correct "R″ ′" to read -- R‴ --

Column 57, top and left of Formula 5-9: Please correct "R″ ′" to read -- R‴ --

Column 57, bottom and left of Formula 5-9: Please correct "R″ ′" to read -- R‴ --

Column 57, top and left of Formula 5-10: Please correct "R″ ′" to read -- R‴ --

Column 57, bottom and left of Formula 5-10: Please correct "R″ ′" to read -- R‴ --

Column 57, top and left of Formula 5-11: Please correct "R″ ′" to read -- R‴ --

Column 57, top and center of Formula 5-11: Please correct "R″ ′" to read -- R‴ --

Column 57, bottom and left of Formula 5-11: Please correct "R″ ′" to read -- R‴ --

Column 57, bottom and center of Formula 5-11: Please correct "R″ ′" to read -- R‴ --

Column 57, top and left of Formula 5-12: Please correct "R″ ′" to read -- R‴ --

Column 57, bottom and left of Formula 5-12: Please correct "R″ ′" to read -- R‴ --

Column 59, top and center of Formula 5-15: Please correct "R″ ′" to read -- R‴ --

Column 59, bottom and center of Formula 5-15: Please correct "R″ ′" to read -- R‴ --

Claim 8:

Column 59, Line 66, Chemical Formula 5-1-1: Please correct "$C_{12}H_{26}$" to read -- $C_{12}H_{25}$ --

Column 60, Line 46, Chemical Formula 5-5-1: Please correct "$C_{12}H_{26}$" to read -- $C_{12}H_{25}$ --

Column 60, Line 66, Chemical Formula 5-11-1: Please correct "$C_{12}H_{26}$" to read -- $C_{12}H_{25}$ --

Column 61, Line 20, Chemical Formula 5-16-1: Please correct "$C_{12}H_{26}$" to read -- $C_{12}H_{25}$ --